(12) United States Patent
Ikeda et al.

(10) Patent No.: US 11,867,503 B2
(45) Date of Patent: Jan. 9, 2024

(54) ANOMALY DETECTION SYSTEM FOR SECONDARY BATTERY

(71) Applicant: SEMICONDUCTOR ENERGY LABORATORY CO., LTD., Atsugi (JP)

(72) Inventors: Takayuki Ikeda, Kanagawa (JP); Ryota Tajima, Kanagawa (JP); Yuki Okamoto, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 507 days.

(21) Appl. No.: 17/263,170

(22) PCT Filed: Jul. 24, 2019

(86) PCT No.: PCT/IB2019/056305
§ 371 (c)(1),
(2) Date: Jan. 26, 2021

(87) PCT Pub. No.: WO2020/026079
PCT Pub. Date: Feb. 6, 2020

(65) Prior Publication Data
US 2021/0190471 A1 Jun. 24, 2021

(30) Foreign Application Priority Data
Aug. 3, 2018 (JP) .................................. 2018-146472

(51) Int. Cl.
*G01B 7/00* (2006.01)
*G01B 7/16* (2006.01)
(Continued)

(52) U.S. Cl.
CPC .............. *G01B 7/18* (2013.01); *H01L 27/124* (2013.01); *H01L 27/1207* (2013.01);
(Continued)

(58) Field of Classification Search
CPC ....... G01B 7/18; H10B 99/00; H01L 27/1207; H01L 27/1225; H01L 27/124;
(Continued)

(56) References Cited

U.S. PATENT DOCUMENTS

2004/0182852 A1   9/2004   Knappe et al.
2009/0128159 A1*  5/2009   Nakatsuji ............... G01R 31/52
                                                                324/433
(Continued)

FOREIGN PATENT DOCUMENTS

DE         10305788         9/2004
DE    102018114537 B4 *    5/2022   ............. G01D 5/242
(Continued)

OTHER PUBLICATIONS

International Search Report (Application No. PCT/IB2019/056305) dated Oct. 29, 2019.
(Continued)

*Primary Examiner* — Max H Noori
(74) *Attorney, Agent, or Firm* — NIXON PEABODY LLP; Jeffrey L. Costellia

(57) ABSTRACT

An anomaly detection system that outputs an anomaly detection signal before a safety valve of a secondary battery is opened is provided. The anomaly detection system includes a strain sensor, a memory, and a comparator. The memory has a function of retaining an analog potential, and the comparator has a function of comparing a potential output by the strain sensor and the analog potential retained by the memory. The strain sensor is attached to the secondary battery before use, and a predetermined potential is retained in the memory. When a housing of the secondary battery expands while the secondary battery is used, and the
(Continued)

potential output by the strain sensor becomes higher (or lower) than the predetermined potential, an anomaly detection signal is output.

9 Claims, 16 Drawing Sheets

(51) Int. Cl.
- *H01L 27/12* (2006.01)
- *H01L 29/423* (2006.01)
- *H01L 29/786* (2006.01)
- *H03K 5/24* (2006.01)
- *H03K 21/08* (2006.01)
- *H01M 10/48* (2006.01)
- *H10B 99/00* (2023.01)

(52) U.S. Cl.
CPC ...... *H01L 27/1225* (2013.01); *H01L 27/1255* (2013.01); *H01L 29/42384* (2013.01); *H01L 29/7869* (2013.01); *H01M 10/48* (2013.01); *H03K 5/24* (2013.01); *H03K 21/08* (2013.01); *H10B 99/00* (2023.02)

(58) Field of Classification Search
CPC ........... H01L 27/1255; H01L 29/42384; H01L 29/7869; H01M 10/48; H03K 5/24; H03K 21/08
USPC .................................................... 73/962.628
See application file for complete search history.

(56) References Cited

U.S. PATENT DOCUMENTS

| | | | |
|---|---|---|---|
| 2012/0057396 A1 | 3/2012 | Yamazaki et al. | |
| 2017/0141360 A1 | 5/2017 | Brun-Buisson et al. | |
| 2018/0013299 A1* | 1/2018 | Abe | H02J 7/0029 |
| 2019/0044196 A1* | 2/2019 | Kang | H01M 4/628 |
| 2019/0081369 A1* | 3/2019 | Monden | H02J 7/00 |
| 2020/0278398 A1* | 9/2020 | Isa | G01R 31/389 |
| 2021/0126473 A1* | 4/2021 | Ikeda | H01M 50/574 |
| 2022/0190398 A1* | 6/2022 | Ikeda | H01M 10/48 |

FOREIGN PATENT DOCUMENTS

| | | |
|---|---|---|
| EP | 1460386 A | 9/2004 |
| EP | 3120399 A | 1/2017 |
| JP | 2002-008616 A | 1/2002 |
| JP | 2002-117911 A | 4/2002 |
| JP | 2002-289265 A | 10/2002 |
| JP | 2004-251901 A | 9/2004 |
| JP | 2010-011619 A | 1/2010 |
| JP | 2012-256820 A | 12/2012 |
| JP | 2016-200539 A | 12/2016 |
| JP | 2017-003370 A | 1/2017 |
| WO | WO-2015/140721 | 9/2015 |

OTHER PUBLICATIONS

Written Opinion (Application No. PCT/IB2019/056305) dated Oct. 29, 2019.
Cheng.X et al., "In Situ Stress Measurement Techniques on Li-ion Battery Electrodes: a Review", Energies 2017, Apr. 27, 2017, vol. 10, No. 5, 591, pp. 1-19.
Ladpli.P et al., "Estimating Lithium-ion Battery State of Charge and Health with Ultrasonic Guided Waves Using an Efficient Matching Pursuit Technique", 2018 IEEE Transportation Electrification Conference and Expo, Asia-Pacific (ITEC Asia-Pacific), Jun. 6, 2018.
Nascimento.M et al., "Real time thermal monitoring of lithium batteries with fiber sensors and thermocouples: a comparative study", Measurement, Jul. 26, 2017, vol. 111, pp. 260-263.
Jiang.X et al., "Mechanical Behavior of Lithium-Ion Battery Component Materials and Error Sources Analysis for Test Results", SAE International Journal of Materials and Manufacturing, Aug. 21, 2016, vol. 9, No. 3, pp. 614-621.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Kato.K et al., "Evaluation of off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC—IGZO and its Application", ECS Transactions, Oct. 1, 2014, vol. 64, No. 10, pp. 155-164, The Electrochemical Society.
Matsuda.S et al., "30-nm-Channel-Length C-Axis Aligned Crystalline In—Ga—Zn—O Transistors with Low off-State Leakage Current and Steep Subthreshold Characteristics", 2015 Symposium on VLSI Technology : Digest of Technical Papers, 2015, pp. T216-T217.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.

\* cited by examiner

100

110

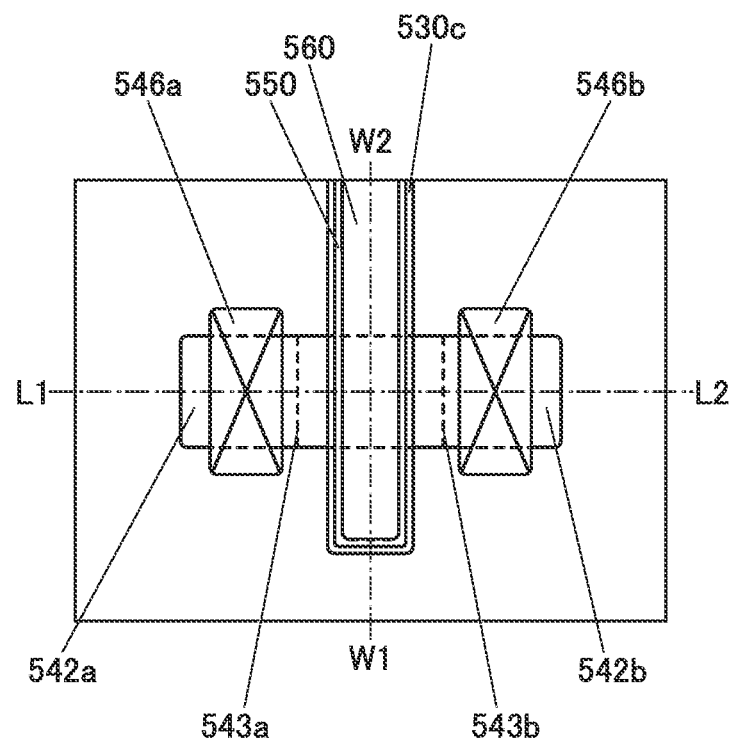
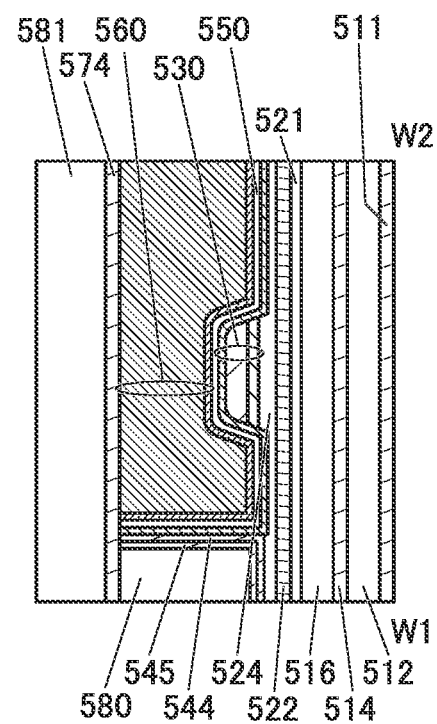
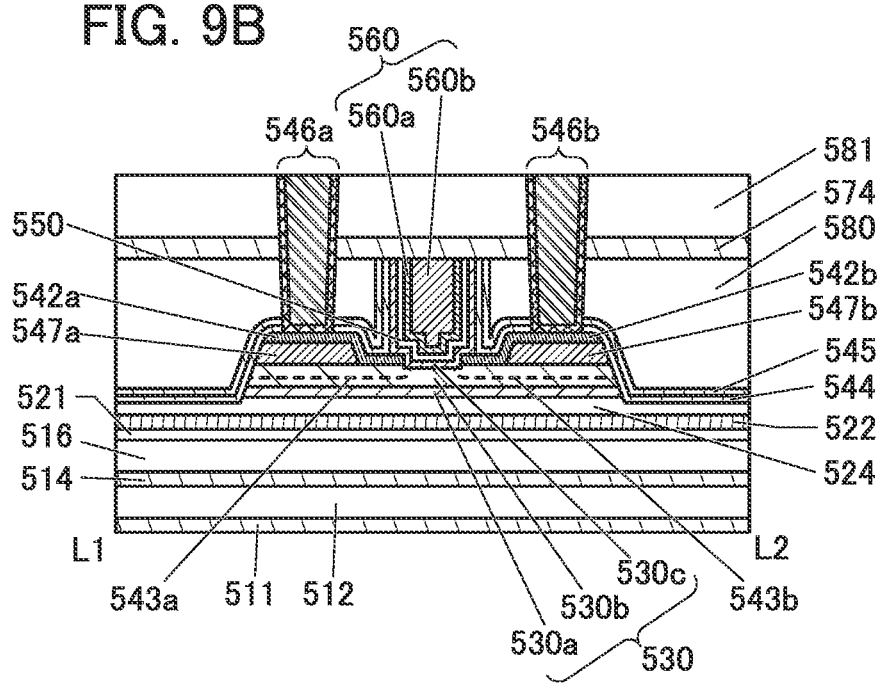

5700

ANOMALY DETECTION SYSTEM FOR SECONDARY BATTERY

TECHNICAL FIELD

One embodiment of the present invention relates to an anomaly detection system for a secondary battery. The anomaly detection system disclosed in this specification and the like is a semiconductor device, which detects anomalies in a secondary battery including a safety valve, in particular.

Note that in this specification and the like, a semiconductor device refers to all devices that can function by utilizing semiconductor characteristics. For example, a transistor, a semiconductor circuit, an integrated circuit, a chip including an integrated circuit, an electronic component including a packaged chip, and an electronic device including an integrated circuit are examples of a semiconductor device.

Note that the technical field of the invention disclosed in this specification and the like relates to an object, a method, or a manufacturing method. One embodiment of the present invention relates to a process, a machine, manufacture, or a composition of matter.

BACKGROUND ART

Various secondary batteries have been actively developed recently. Among them, lithium ion secondary batteries, which have high output power and high power density, are used in portable information terminals such as cellular phones, smartphones, tablets, and laptop personal computers, clean-energy automobiles such as hybrid energy vehicles (HEVs), plug-in hybrid energy vehicles (PHEVs), and electric vehicles (EVs), digital cameras, portable music players, medical devices, and the like, and lithium ion secondary batteries are essential as energy supply sources in the modern society.

In the lithium-ion secondary battery, when the temperature inside the battery increases owing to an external short-circuit, an internal short-circuit, overcharge, overdischarge, or the like, a gas may be generated owing to the chemical reaction of an electrolyte solution, or an organic substance contained in the electrolyte solution may be evaporated, for example, so that the internal pressure of the battery increases in some cases. When the housing of the battery cannot withstand the increased internal pressure of the lithium ion secondary battery, there might be a risk of explosion, fire, or the like of the battery; therefore, a lithium ion secondary battery sometimes has a safety valve that is broken easily as compared to the other housing members.

For example, Patent Document 1 discloses a secondary battery with simplified formation process of a safety valve. Patent Document 2 discloses a method for detecting the expansion of a battery stored in a battery storage space.

Meanwhile, in recent years, an oxide semiconductor has been attracting attention as a semiconductor that is applicable to a transistor. A transistor including an oxide semiconductor (also referred to as an oxide semiconductor transistor or an OS transistor) has the following features, for example: the off-state current of the transistor is extremely small; a voltage (also referred to as a potential difference) applied between the source and the drain can be high (in other words, the withstand voltage is high); it is a thin film transistor and can be stacked.

For example, Patent Document 3 discloses a semiconductor device including a plurality of memory cells using OS transistors over a semiconductor substrate where peripheral circuits such as a driver circuit and a control circuit are formed, and an example in which an OS transistor is used in a memory cell of a DRAM (Dynamic Random Access Memory). It has the following features: it is possible to reduce the chip area by providing the memory cell over the semiconductor substrate where the peripheral circuits are formed; stored data can be retained for a long time with the use of the OS transistor in the memory cell because of an extremely low off-state current of the OS transistor.

In addition, not only single-component metal oxides, such as indium oxide and zinc oxide, but also multi-component metal oxides are known as oxide semiconductors, for example. Among the multi-component metal oxides, in particular, an In—Ga—Zn oxide (also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3).

Non-Patent Document 1 and Non-Patent Document 2 disclose a technique for fabricating a transistor using an oxide semiconductor having a CAAC structure. Moreover, Non-Patent Document 4 and Non-Patent Document 5 disclose that a fine crystal is included even in an oxide semiconductor which has lower crystallinity than an oxide semiconductor having the CAAC structure or the nc structure.

Non-Patent Document 6 reports the extremely low off-state current of a transistor using an oxide semiconductor, and Non-Patent Document 7 and Non-Patent Document 8 report an LSI and a display which utilize such a property of extremely low off-state current.

REFERENCE

Patent Document

[Patent Document 1] Japanese Published Patent Application No. 2002-8616
[Patent Document 2] Japanese Published Patent Application No. 2002-117911
[Patent Document 3] Japanese Published Patent Application No. 2012-256820

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazai, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

Although a safety valve of a lithium-ion secondary battery is made to break easily (made fragile) as compared to the other housing members, when the internal pressure increases high enough to open the safety valve and the safety valve is opened, the pressure may be released explosively. Furthermore, the electrolyte solution and the like in the battery may leak. Therefore, the battery with the safety valve opened cannot be used, and a strain may be applied to the battery and an electronic device in which the battery is mounted. Moreover, the electrolyte solution or the like in the battery may pollute the battery and the electronic device in which the battery is mounted.

An object of the present invention is to prevent a risk caused by an increase in the internal pressure of a secondary battery, that is, to detect an increase in the internal pressure of a secondary battery with a safety valve before the safety valve is opened.

An object of one embodiment of the present invention is to provide an anomaly detection system that detects an increase in the internal pressure of a secondary battery with a safety valve before the safety valve is opened and outputs an anomaly detection signal (also referred to as an anomaly sensing signal). Another object of one embodiment of the present invention is to provide an anomaly detection system with low power consumption.

Note that one embodiment of the present invention does not necessarily achieve all the above objects and only needs to achieve at least one of the objects. The descriptions of the above objects do not preclude the existence of other objects. Objects other than these will be apparent from the description of the specification, the claims, the drawings, and the like, and objects other than these can be derived from the description of the specification, the claims, the drawings, and the like.

Means for Solving the Problems

One embodiment of the present invention is an anomaly detection system including a strain sensor, a memory, and a comparator. The memory has a function of retaining an analog potential, and the comparator has a function of comparing a first potential output by the strain sensor and a second potential retained by the memory. The anomaly detection system has a function of performing an initialization operation in which the second potential higher than the first potential is retained in the memory, and an anomaly detection signal is output when the first potential becomes a potential higher than the second potential.

One embodiment of the present invention is an anomaly detection system including a strain sensor, a memory, and a comparator. The memory has a function of retaining an analog potential, and the comparator has a function of comparing a first potential output by the strain sensor and a second potential retained by the memory. The anomaly detection system has a function of performing an initialization operation in which the second potential lower than the first potential is retained in the memory, and an anomaly detection signal is output when the first potential becomes a potential lower than the second potential.

One embodiment of the present invention is an anomaly detection system including a strain sensor, a memory, and a comparator. The strain sensor includes a resistor and a strain sensor element, and the strain sensor element is attached to a secondary battery. The memory has a function of retaining an analog potential, and the comparator has a function of comparing a first potential output by the strain sensor and a second potential retained by the memory. The anomaly detection system has a function of performing an initialization operation in which the second potential higher than the first potential is retained in the memory, and an anomaly detection signal is output when the first potential becomes a potential higher than the second potential.

One embodiment of the present invention is an anomaly detection system including a strain sensor, a memory, and a comparator. The strain sensor includes a resistor and a strain sensor element, and the strain sensor element is attached to a secondary battery. The memory has a function of retaining an analog potential, and the comparator has a function of comparing a first potential output by the strain sensor and a second potential retained by the memory. The anomaly detection system has a function of performing an initialization operation in which the second potential lower than the first potential is retained in the memory, and an anomaly detection signal is output when the first potential becomes a potential lower than the second potential.

One embodiment of the present invention is an anomaly detection system including a strain sensor, a memory, a comparator, an oscillation circuit, and a counter circuit. The memory has a function of retaining an analog potential, and the comparator has a function of comparing a first potential output by the strain sensor and a second potential retained by the memory. The anomaly detection system has a function of performing an initialization operation in which the second potential higher than the first potential is retained in the memory, and the oscillation circuit generates an AC signal when the first potential becomes a potential higher than the second potential. The counter circuit has a function of counting the number of oscillations of the AC signal, and an anomaly detection signal is output when the number of oscillations reaches a predetermined number of times.

One embodiment of the present invention is an anomaly detection system including a strain sensor, a memory, a comparator, an oscillation circuit, and a counter circuit. The memory has a function of retaining an analog potential, and the comparator has a function of comparing a first potential output by the strain sensor and a second potential retained by the memory. The anomaly detection system has a function of performing an initialization operation in which the second potential lower than the first potential is retained in the memory, and the oscillation circuit generates an AC signal when the first potential becomes a potential lower than the second potential. The counter circuit has a function of counting the number of oscillations of the AC signal, and an anomaly detection signal is output when the number of oscillations reaches a predetermined number of times.

One embodiment of the present invention is an anomaly detection system including a strain sensor, a memory, a comparator, an oscillation circuit, and a counter circuit. The strain sensor includes a resistor and a strain sensor element, and the strain sensor element is attached to a secondary battery. The memory has a function of retaining an analog potential, and the comparator has a function of comparing a first potential output by the strain sensor and a second potential retained by the memory. The anomaly detection system has a function of performing an initialization operation in which the second potential higher than the first potential is retained in the memory, and the oscillation circuit generates an AC signal when the first potential becomes a potential higher than the second potential. The counter circuit has a function of counting the number of oscillations of the AC signal, and an anomaly detection signal is output when the number of oscillations reaches a predetermined number of times.

One embodiment of the present invention is an anomaly detection system including a strain sensor, a memory, a comparator, an oscillation circuit, and a counter circuit. The strain sensor includes a resistor and a strain sensor element, and the strain sensor element is attached to a secondary battery. The memory has a function of retaining an analog potential, and the comparator has a function of comparing a first potential output by the strain sensor and a second potential retained by the memory. The anomaly detection system has a function of performing an initialization operation in which the second potential lower than the first potential is retained in the memory, and the oscillation circuit generates an AC signal when the first potential becomes a potential lower than the second potential. The counter circuit has a function of counting the number of oscillations of the AC signal, and an anomaly detection signal is output when the number of oscillations reaches a predetermined number of times.

In any of the above embodiments, the memory includes a transistor and a capacitor, and the transistor includes a metal oxide in a channel formation region.

Effect of the Invention

According to one embodiment of the present invention, an anomaly detection system that detects an increase in the internal pressure of a secondary battery with a safety valve before the safety valve is opened and outputs an anomaly detection signal can be provided. According to one embodiment of the present invention, an anomaly detection system with low power consumption can be provided.

Note that the descriptions of the effects do not disturb the existence of other effects. One embodiment of the present invention does not necessarily have all the effects. Effects other than these will be apparent from the descriptions of the specification, the claims, the drawings, and the like, and effects other than these can be derived from the descriptions of the specification, the claims, the drawings, and the like.

BRIEF DESCRIPTION OF THE DRAWINGS

FIG. 9(A) is a top view illustrating a structure example of a transistor, and FIGS. 9(B) and 9(C) are cross-sectional views illustrating the structure example of the transistor.

MODE FOR CARRYING OUT THE INVENTION

Figure 1A:
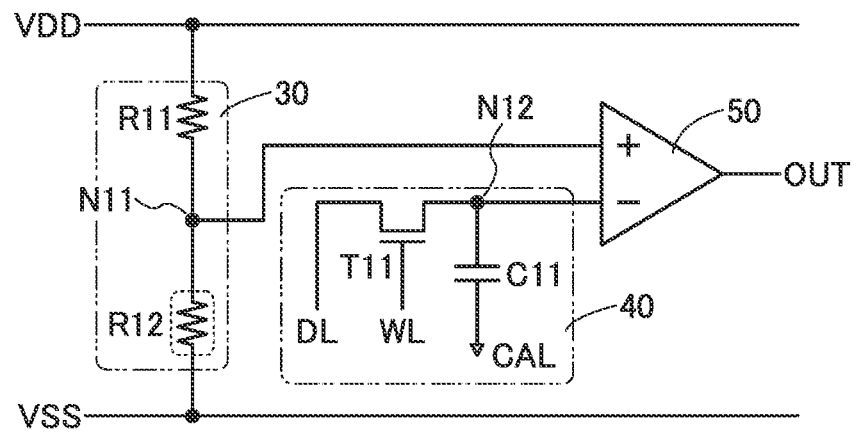
FIGS. 1(A) and 1(B) are block diagrams illustrating structure examples of an anomaly detection system.

Embodiments will be described below with reference to the drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate actual components completely according to their functions, and it is possible for one component to relate to a plurality of functions.

In the drawings and the like, the size, the layer thickness, the region, or the like is exaggerated for clarity in some cases. Therefore, the size, the layer thickness, or the region is not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

Moreover, in this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "voltage" often refers to a potential difference between a given potential and a reference potential (e.g., a ground potential). Thus, a voltage and a potential difference can be interchanged with each other.

In this specification and the like, a transistor is an element having at least three terminals including a gate, a drain, and a source. A channel formation region is included between the drain (a drain terminal, a drain region, or a drain electrode) and the source (a source terminal, a source region, or a source electrode), and current can flow between the source and the drain through the channel formation region. Note that in this specification and the like, a channel region refers to a region through which current mainly flows.

Furthermore, functions of a source and a drain might be switched when a transistor of opposite polarity is employed or when a direction of current flow is changed in circuit operation, for example. Thus, the terms of a source and a drain are interchangeable for use in this specification and the like.

Furthermore, unless otherwise specified, an off-state current in this specification and the like refers to a drain current of a transistor in a non-conduction state (also referred to as an off state or a cutoff state). Unless otherwise specified, the non-conduction state of an n-channel transistor refers to a state where a voltage Vgs of a gate with respect to a source is lower than a threshold voltage Vth, and the non-conduction state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of off-state current, the drain may be replaced with the source. That is, the off-state current sometimes refers to a source current when the transistor is in a non-conduction state. In addition, leakage current sometimes expresses the same meaning as off-state current. In this specification and the like, the off-state current sometimes refers to a current that flows between a source and a drain when a transistor is in a non-conduction state.

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is called an oxide semiconductor in some cases. That is, in the case where a metal oxide has at least one of an amplifying function, a rectifying function, and a switching function, the metal oxide can be called a metal oxide semiconductor. In other words, a transistor containing a metal oxide in a channel formation region can be referred to as an "oxide semiconductor transistor" or an "OS transistor". Similarly, the "transistor using an oxide semiconductor" described above is also a transistor containing a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, structure examples of an anomaly detection system of one embodiment of the present invention will be described. The anomaly detection system of one embodiment of the present invention is a system that functions by utilizing semiconductor characteristics, and detects an anomaly in a secondary battery with a safety valve, in particular.

<Structure Examples of Anomaly Detection System>

FIG. 1(A) is a block diagram illustrating a structure example of an anomaly detection system 100. The anomaly detection system 100 includes a strain sensor 30, a memory 40, and a comparator 50.

In addition, the anomaly detection system 100 includes a wiring VDD, a wiring VSS, and an output terminal OUT. A high power supply potential Vd is supplied to the wiring VDD, and a low power supply potential Vs is supplied to the wiring VSS. Here, the high power supply potential Vd is a potential higher than the low power supply potential Vs.

The comparator 50 includes a non-inverting input terminal (denoted by "+" in FIG. 1(A)), an inverting input terminal (denoted by "−" in FIG. 1(A)), and an output terminal and has a function of comparing a potential input to the non-inverting input terminal and a potential input to the inverting input terminal.

Specifically, when the potential input to the non-inverting input terminal is higher than the potential input to the inverting input terminal, a maximum potential is output from the output terminal; when the potential input to the non-inverting input terminal is lower than the potential input to the inverting input terminal, a minimum potential is output from the output terminal. Note that in this embodiment, the comparator 50 operates by utilizing a potential difference between the high power supply potential Vd and the low power supply potential Vs. The maximum potential is the high power supply potential Vd, and the minimum potential is the low power supply potential Vs.

The strain sensor 30 includes a resistor R11 and a strain sensor element R12. A first terminal of the resistor R11 is electrically connected to the wiring VDD, and a second terminal of the resistor R11 is electrically connected to a first terminal of the strain sensor element R12 and the non-inverting input terminal of the comparator 50. A second terminal of the strain sensor element R12 is electrically connected to the wiring VSS.

The memory 40 includes a capacitor C11 and a transistor T11. One of a source and a drain of the transistor T11 is electrically connected to a wiring DL, a gate of the transistor T11 is electrically connected to a wiring WL, and the other of the source and the drain of the transistor T11 is electrically connected to a first terminal of the capacitor C11 and the inverting input terminal of the comparator 50. A second terminal of the capacitor C11 is electrically connected to a wiring CAL. The wiring CAL is a wiring to which a predetermined potential Vc is supplied.

Here, a node to which the second terminal of the resistor R11, the first terminal of the strain sensor element R12, and the non-inverting input terminal of the comparator 50 are electrically connected is referred to as a node N11, and a node to which the other of the source and the drain of the transistor T11, the first terminal of the capacitor C11, and the inverting input terminal of the comparator 50 are electrically connected is referred to as anode N12. In this case, the comparator 50 has a function of comparing the potential of the node N1 and the potential of the node N12.

That is, the comparator 50 outputs the high power supply potential Vd from the output terminal when the potential of the node N11 is higher than the potential of the node N12 and outputs the low power supply potential Vs from the output terminal when the potential of the node N11 is lower than the potential of the node N12. The output terminal of the comparator 50 is electrically connected to the output terminal OUT included in the anomaly detection system 100.

Figure 1B:
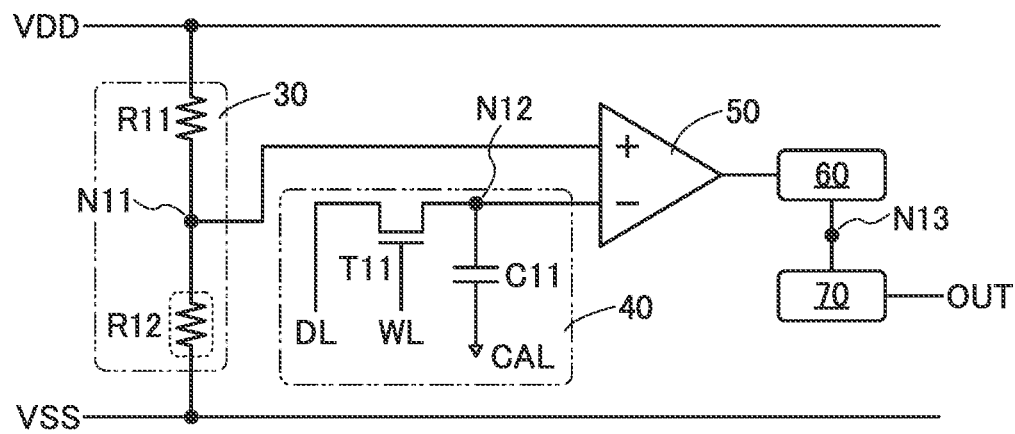

The anomaly detection system 100 can further include an oscillator circuit 60 and a circuit 70. FIG. 1(B) is a block diagram illustrating a structure example of an anomaly detection system 110.

The anomaly detection system 110 is a system in which the oscillator circuit 60 and the circuit 70 are added to the anomaly detection system 100. In the anomaly detection system 110, the output terminal of the comparator 50 is electrically connected to an input terminal of the oscillator circuit 60, an output terminal of the oscillator circuit 60 is electrically connected to an input terminal of the circuit 70, and an output terminal of the circuit 70 is electrically connected to the output terminal OUT included in the anomaly detection system 110. Note that the connection relationship among the strain sensor 30, the memory 40, and the comparator 50 in the anomaly detection system 110 are similar to that in the anomaly detection system 100; therefore, description thereof is omitted. A node to which the output terminal of the oscillator circuit 60 and the input terminal of the circuit 70 are electrically connected is referred to as a node N13.

When the comparator 50 outputs the high power supply potential Vd, the oscillator circuit 60 starts oscillating and outputs an AC signal. When the comparator 50 outputs the low power supply potential Vs, the oscillation circuit 60 stops oscillating and outputs a constant potential (e.g., the low power supply potential Vs).

The circuit 70 is a circuit composed of a counter and a decoder. The circuit 70 has a function of counting the number of oscillations of the AC signals output by the oscillator circuit 60 and outputting the high power supply potential Vd when the number of oscillations reaches a predetermined number of times. Until the number of oscillations reaches the predetermined number of times, the circuit 70 outputs the low power supply potential Vs. When the oscillator circuit 60 stops oscillating, the circuit 70 outputs the low power supply potential Vs and resets the counter.

<Timing Charts>

Figure 2A:
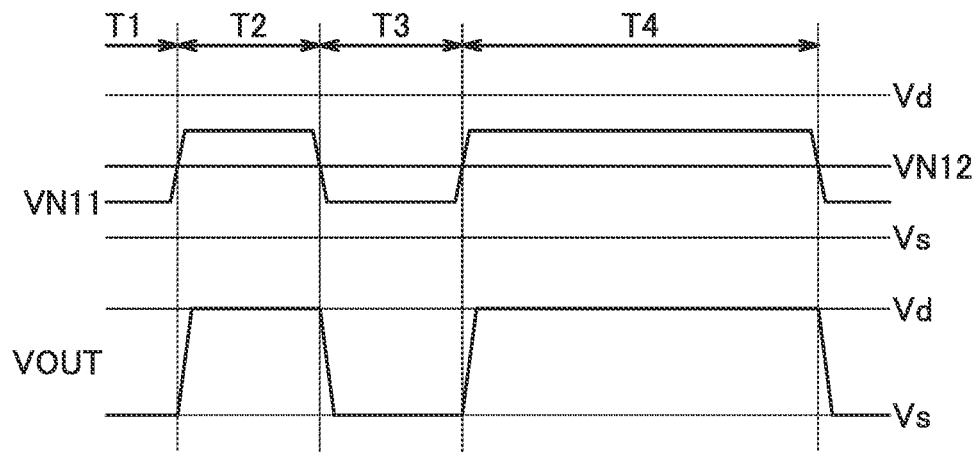
FIGS. 2(A) and 2(B) are timing charts showing operation examples of the anomaly detection system.
Figure 2B:
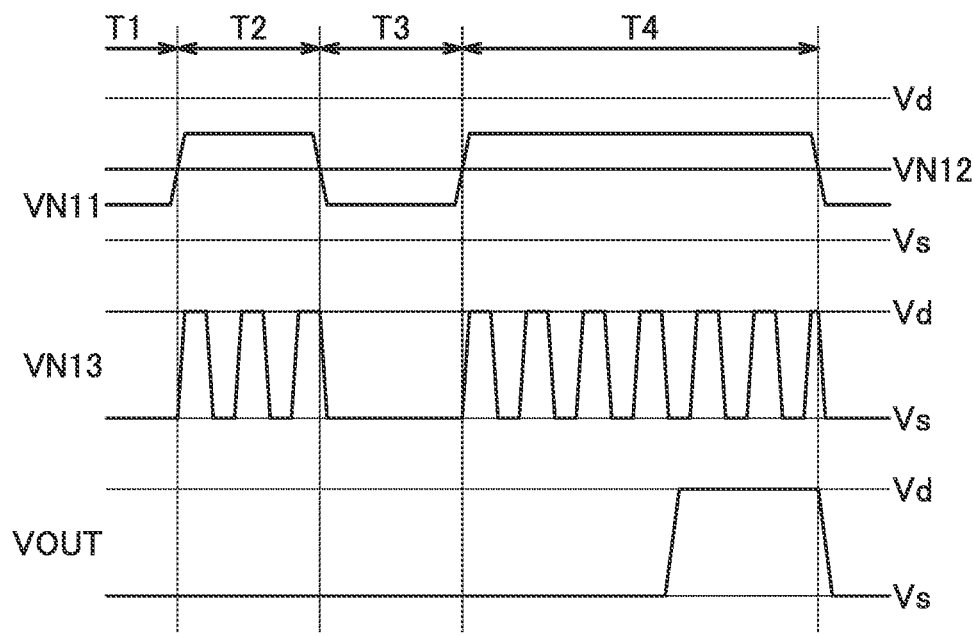

FIG. 2(A) is a timing chart showing an operation example of the anomaly detection system 100, and FIG. 2(B) is a timing chart showing an operation example of the anomaly detection system 110.

In FIG. 2(A) and FIG. 2(B), the horizontal axis represents time, and T1 to T4 represent periods. In FIG. 2(A) and FIG. 2(B), the vertical axis represents potentials: VN11 is the potential of the node N11, VN12 is the potential of the node N12, and VN13 is the potential of the node N13. Note that VN12 is dented by a dotted line to distinguish VN12 from VN11. In FIG. 2(A), VOUT is the potential of the output terminal OUT of the anomaly detection system 100, and in FIG. 2(B), VOUT is the potential of the output terminal OUT of the anomaly detection system 110.

After a potential higher than that of the node N11 is retained in the node N12 (after an initialization operation is performed) in the period T1 in FIG. 2(A), VN12 is a constant value from the period T1 to the period T4. VN11 is lower than VN12 in the period T1 and the period T3, and VN11 is higher than VN12 in the period T2 and the period T4. In other words, VOUT is the low power supply potential Vs in the period T1 and the period T3 in FIG. 2(A), and VOUT is the high power supply potential Vd in the period T2 and the period T4.

A potential higher than that of the node N11 is retained in the node N12 (an initialization operation is performed) in the period T1 in FIG. 2(B), and subsequently, VN12 is a constant value from the period T1 to the period T4. VN11 is lower than VN12 in the period T1 and the period T3, and VN11 is higher than VN12 in the period T2 and the period T4. VN13 is the low power supply potential Vs in the period T1 and the period T3 in FIG. 2(B), and VN13 oscillates in the period T2 and the period T4. In other words, VN13 goes up and down between the low power supply potential Vs and the high power supply potential Vd in the period 12 and the period T4.

Here, when VN13 goes up and down between the low power supply potential Vs and the high power supply potential Vd more than a predetermined number of times, VOUT becomes the high power supply potential Vd. Until the predetermined number of times is satisfied, VOUT remains the low power supply potential Vs. For example, the predetermined number of times can be four in FIG. 2(B).

In the period T1 in FIG. 2(B), VOUT is the low power supply potential Vs. In the period T2, the predetermined number of times is not satisfied although VN13 oscillates, so that VOUT remains the low power supply potential Vs. In the period T3, VN13 does not oscillate, so that VOUT remains the low power supply potential Vs and the number of times counted in the period 12 is reset. That is, VOUT remains the low power supply potential Vs from the period T1 to the period T3 in FIG. 2(B).

In the period T4 in FIG. 2(B), VN13 oscillates and the predetermined number of times is satisfied, so that VOUT becomes the high power supply potential Vd in the middle of the period T4. VN13 does not oscillates after the period T4 is terminated, so that the VOUT becomes the low power supply potential Vs.

This can inhibit VOUT from changing from the low power supply potential Vs to the high power supply potential Vd even when VN11 is higher than VN12 temporarily owing to noise or the like. For example, when an electronic device including the anomaly detection system 110 is dropped, a malfunction of the anomaly detection system 110 can be inhibited.

<Structure Example of Strain Sensor>

As illustrated in FIG. 1(A) and FIG. 1(B), the strain sensor 30 can be formed with the resistor R11 and the strain sensor element R12 that are connected in serial.

The strain sensor element R12 is a variable resistor the resistance value of which is changed in response to applied strain. Typically, a metal thin film resistor can be used as the strain sensor element R12. The metal thin film resistor has a property such that the resistance value is increased when tractive force is applied to the metal thin film and the resistance value is decreased when compression force is applied to the metal thin film, for example. A strain in the vicinity of a region where the metal thin film resistor is provided can be detected owing to the change in the resistance value of the metal thin film resistor.

Figure 2C:
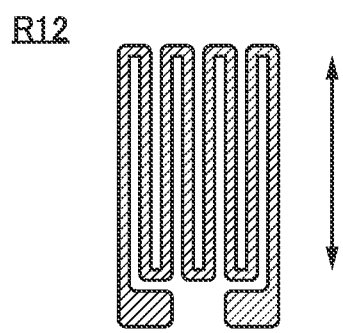
FIG. 2(C) is a top view illustrating a structure example of a strain sensor element.

FIG. 2(C) is a top view illustrating a structure example of the strain sensor element R12. The strain sensor element R12 can mainly detect strains in arrow directions shown in FIG. 2(C). Note that a plurality of strain sensor elements R12 may be disposed in accordance with the direction in which strains can be detected.

A semiconductor element may be used as the strain sensor element R12. Alternatively, a piezoelectric element may be used as the strain sensor element R12. As the piezoelectric element, an element including a piezoelectric substance such as barium titanate, lead zirconate titanate, or zinc oxide can be used, for example.

<Structure Example of Memory>

As illustrated in FIG. 1(A) and FIG. 1(B), the memory 40 can be formed with the capacitor C11 and the transistor T11.

The memory 40 has a function of accumulating and retaining charge in the node N12. The memory 40 can retain an analog potential in the node N12. Therefore, it is preferable that the off-state current of the transistor T1 be low. An OS transistor can be used as the transistor T11, for example.

An oxide semiconductor has a bandgap of 2.5 eV or larger, preferably 3.0 eV or larger; thus, an OS transistor has characteristics of low leakage current due to thermal excitation and extremely low off-state current.

A metal oxide used in a channel formation region of the OS transistor is preferably an oxide semiconductor containing at least one of indium (In) and zinc (Zn). Typical examples of such an oxide semiconductor include an In-M-Zn oxide (an element M is Al, Ga, Y, or Sn, for example). Reducing both impurities serving as electron donors, such as moisture or hydrogen, and oxygen vacancies can make an oxide semiconductor i-type (intrinsic) or substantially i-type. Such an oxide semiconductor can be referred to as a highly purified oxide semiconductor. Note that the details of an OS transistor will be described in Embodiment 4.

An OS transistor has an extremely low off-state current and thus is suitably used as the transistor T11. An off-state current per micrometer of channel width of an OS transistor can be, for example, lower than or equal to 100 zA/μm, lower than or equal to 10 zA/μm, lower than or equal to 1 zA/μ, or lower than or equal to 10 yA/μm. The use of an OS transistor as the transistor T11 enables the memory 40 to retain the analog potential for a long time.

Alternatively, a transistor with a low off-state current other than the OS transistor may be used as the transistor T11. For example, a transistor in which a channel formation region includes a semiconductor with a wide bandgap can be used. The semiconductor with a wide bandgap refers to a semiconductor whose bandgap is higher than or equal to 2.2 eV in some cases, and examples thereof include silicon carbide, gallium nitride, and diamond.

The transistor T11 has a function of a switch for controlling conduction or non-conduction between the node N12 and the wiring DL. A high-level potential is applied to the wiring WL to bring the transistor T11 into a conduction state, whereby an analog potential is written to the node N12. Specifically, when the transistor T11 is in a conduction state, an analog potential to be written to the wiring DL is applied, so that the potential is written to the node N12. After that, a low-level potential is applied to the wiring WL to bring the transistor T11 into a non-conduction state, whereby the potential of the node N12 is retained. Note that in this embodiment, the high-level potential can be the high power supply potential Vd and the low-level potential can be the low power supply potential Vs, for example.

The potential retained in the node N12 is input as VN12 to the inverting input terminal of the comparator 50 to be compared with VN11 input to the non-inverting input terminal of the comparator 50.

<Application Example of Anomaly Detection System>

As illustrated in FIG. 1(A) and FIG. 1(B), the resistor R11 and the strain sensor element R12 that are connected in series serve as the strain sensor 30 and are electrically connected to the wiring VDD and the wiring VSS. That is, the potential difference between the high power supply potential Vd and the low power supply potential Vs is divided by the resistor R11 and the strain sensor element R12, and the potential of the node N11 (VN11) becomes a potential between the high power supply potential Vd and the low power supply potential Vs. VN11 is a potential which the strain sensor 30 outputs to the comparator 50.

The strain sensor 30 (or the strain sensor element R12) is attached to a housing of a secondary battery before use (or in the early stages of use). Then, a potential slightly higher than VN11 that is obtained at that time is retained as VN12 in the memory 40. Since VN11 is lower than VN12, the comparator 50 outputs the low power supply potential Vs.

As the secondary battery is used, the internal pressure of the battery sometimes increases. In this case, the housing of the secondary battery expands, and tractive force is applied to the strain sensor 30 (or the strain sensor element R12) attached to the housing of the secondary battery. The resistance value of the strain sensor element R12 increases when tractive force is applied to the strain sensor element R12, so that VN11 becomes higher. When VN11 is increased and VN11 becomes higher than VN12, the comparator 50 outputs the high power supply potential Vd.

As for the series connection of the resistor R11 and the strain sensor element R12, the resistor R11 and the strain sensor element R12 may be replaced with each other. In other words, the resistor R11 may be electrically connected to the wiring VSS and the strain sensor element R12 may be electrically connected to the wiring VDD. In this case, a potential slightly lower than VN11 is retained as VN12 in the memory 40, and when the housing of the secondary battery expands, VN11 becomes lower than VN12. In addition, the output of the comparator 50 is inversed, and the non-inverting input terminal and the inverting input terminal of the comparator 50 may be replaced with each other.

In this manner, the anomaly detection system 100 (or the anomaly detection system 110) can output an anomaly detection signal when the housing of the secondary battery expands. Note that the strain sensor 30 (or the strain sensor element R12) is preferably attached to a position where a large distortion is caused when the housing of the secondary battery expands. For example, the position is the vicinity of a safety valve in the case of a cylindrical secondary battery or a large surface in the case of a rectangular secondary battery, as described in Embodiment 2.

<Others>

The comparator 50, the oscillator circuit 60, and the circuit 70 may be composed using OS transistors or transistors formed on a semiconductor substrate. There is no particular limitation on the semiconductor substrate as long as a channel region of the transistor can be formed thereon. For example, a single crystal silicon substrate, a single crystal germanium substrate, a compound semiconductor substrate (such as a SiC substrate or a GaN substrate), an SOI (Silicon on Insulator) substrate, or the like can be used.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by thermal treatment; an ELTRAN method (a registered trademark: Epitaxial Layer Transfer). A transistor formed using a single crystal substrate includes a single crystal semiconductor in a channel formation region.

Furthermore, the OS transistor is a thin film transistor and can be stacked above a transistor formed on a semiconductor substrate. For example, the comparator 50, the oscillator circuit 60, and the circuit 70 are composed using transistors formed on a semiconductor substrate, and an OS transistor is used as the transistor T11 included in the memory 40 and provided to be stacked above the transistors formed on the semiconductor substrate, in which case the chip area of the anomaly detection system can be reduced.

Alternatively, the comparator 50, the oscillator circuit 60, and the circuit 70 may be composed using transistors formed on the semiconductor substrate and OS transistors. The chip area of the anomaly detection system can be reduced when the OS transistors are stacked above the transistors formed on the semiconductor substrate; in addition, the anomaly detection system can be a system with low power consumption because of the extremely low off-state current of the OS transistor. A semiconductor device in which an OS transistor is stacked above a transistor formed on a semiconductor substrate will be described in Embodiment 3.

Alternatively, the comparator 50, the oscillator circuit 60, the circuit 70, and the transistor T11 included in the memory 40 may be composed using OS transistors. In this case, the OS transistors are formed above a semiconductor substrate, whereby the semiconductor substrate can be used for the strain sensor element R12. As the semiconductor substrate, a single crystal silicon substrate or a single crystal germanium substrate can be used, for example.

Note that this embodiment can be implemented in combination with the other embodiments described in this specification as appropriate.

Embodiment 2

In this embodiment, structure examples of a secondary battery in which the anomaly detection system described in the above embodiment detects an anomaly will be described.

Figure 3A:
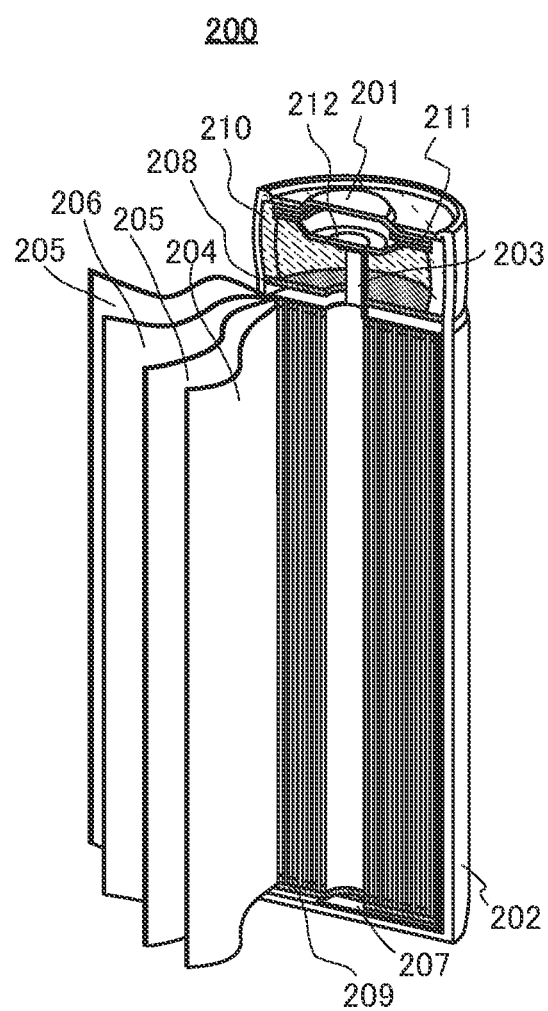
FIG. 3(A) is a diagram illustrating a structure example of a cylindrical secondary battery.

FIG. 3(A) illustrates a structure example of a cylindrical secondary battery 200.

The cylindrical secondary battery 200 includes, as illustrated in FIG. 3(A), a positive electrode cap (battery lid) 201 on the top surface and a battery can (outer can) 202 on the side surface and the bottom surface. The positive electrode cap and the battery can (outer can) 202 are insulated by a gasket (insulating gasket) 210.

Inside the battery can 202 having a hollow cylindrical shape, a battery element in which a belt-like positive electrode 204 and a belt-like negative electrode 206 are wound with a separator 205 located therebetween is provided. Although not illustrated, the battery element is wound centering around a center pin.

One end of the battery can 202 is closed and the other end thereof is opened. For the battery can 202, a metal having corrosion resistance to an electrolyte solution, such as nickel, aluminum, or titanium, an alloy of such a metal, or an alloy of such a metal and another metal (e.g., stainless steel or the like) can be used. Alternatively, the battery can 202 is preferably covered with nickel, aluminum, or the like in order to prevent corrosion due to the electrolyte solution.

Inside the battery can 202, the battery element in which the positive electrode, the negative electrode, and the separator are wound is sandwiched between a pair of insulating plates 208 and 209 that face each other. Furthermore, a nonaqueous electrolyte solution (not illustrated) is injected inside the battery can 202 provided with the battery element. As the nonaqueous electrolyte solution, a nonaqueous electrolyte solution that is similar to that of a coin-type secondary battery can be used.

Since the positive electrode and the negative electrode of the cylindrical secondary battery are wound, active materials are preferably formed on both sides of current collectors. A positive electrode terminal (positive electrode current collector lead) 203 is connected to the positive electrode 204, and a negative electrode terminal (negative electrode current collector lead) 207 is connected to the negative electrode 206. For both the positive electrode terminal 203 and the negative electrode terminal 207, a metal material such as aluminum can be used. The positive electrode terminal 203 and the negative electrode terminal 207 are resistance-welded to a safety valve 212 and the bottom of the battery can 202, respectively.

The safety valve 212 is electrically connected to the positive electrode cap 201 through a PTC element (Positive Temperature Coefficient) 211. The safety valve 212 has a function of opening and releasing the internal pressure of the battery to the outside when the internal pressure of the battery increases and exceeds a predetermined threshold value. The safety valve 212 is made fragile as compared to the other housing members of the secondary battery 200 and therefore is considerably deformed when the internal pressure of the battery increases. The strain sensor (or the strain sensor element R12) included in the anomaly detection system 100 (or the anomaly detection system 110), which is described in the above embodiment, is preferably attached in the vicinity of the safety valve 212, for example.

In addition, the PTC element 211 is a thermally sensitive resistor whose resistance increases as temperature rises, and limits the amount of current by increasing the resistance to prevent abnormal heat generation. Barium titanate (BaTiO$_3$)-based semiconductor ceramics or the like can be used for the PTC element.

Figure 3B:
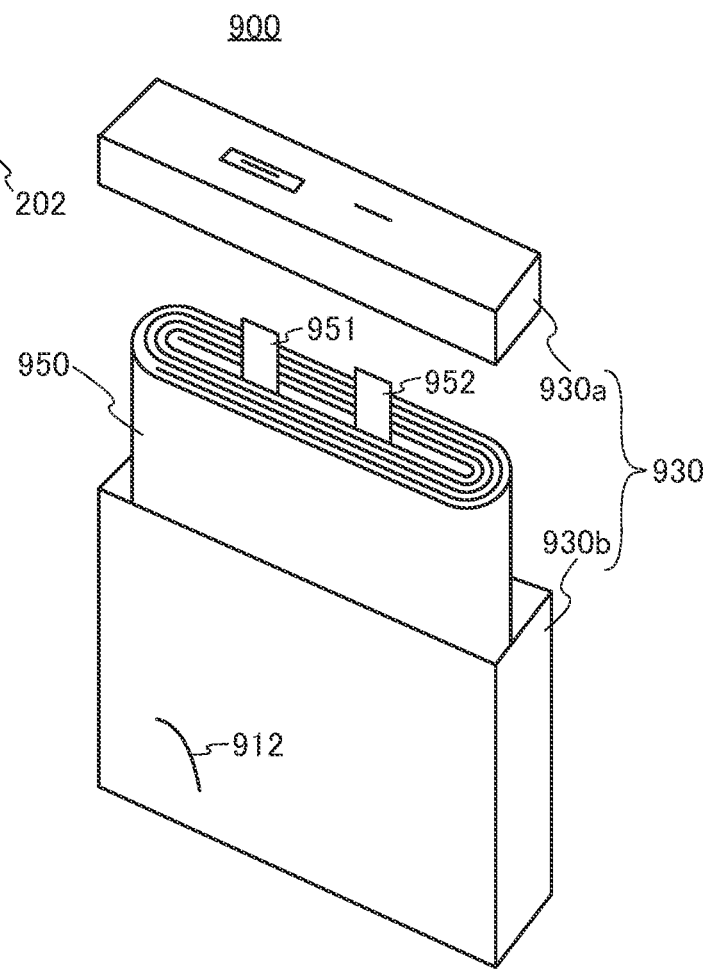
FIG. 3(B) is a diagram illustrating a structure example of a rectangular secondary battery.

FIG. 3(B) illustrates a structure example of a rectangular secondary battery 900.

In the rectangular secondary battery 900, as illustrated in FIG. 3(B), a wound body 950 provided with a terminal 951 and a terminal 952 is disposed in a housing 930a and a housing 930b (hereinafter, the housing 930a and the housing 930b are collectively referred to as a housing 930). The wound body 950 is immersed in an electrolyte solution inside the housing 930. The terminal 952 is in contact with the housing 930, and the terminal 951 is not in contact with the housing 930 with the use of an insulating material or the like.

Note that the housing 930a and the housing 930b are separated as illustrated in FIG. 3(B) for convenience; however, actually, the wound body 950 is covered with the housing 930, and the terminal 951 and the terminal 952 extend to the outside of the housing 930. For the housing 930, a metal material (e.g., aluminum or the like), a resin material, or the like can be used.

Figure 4A:
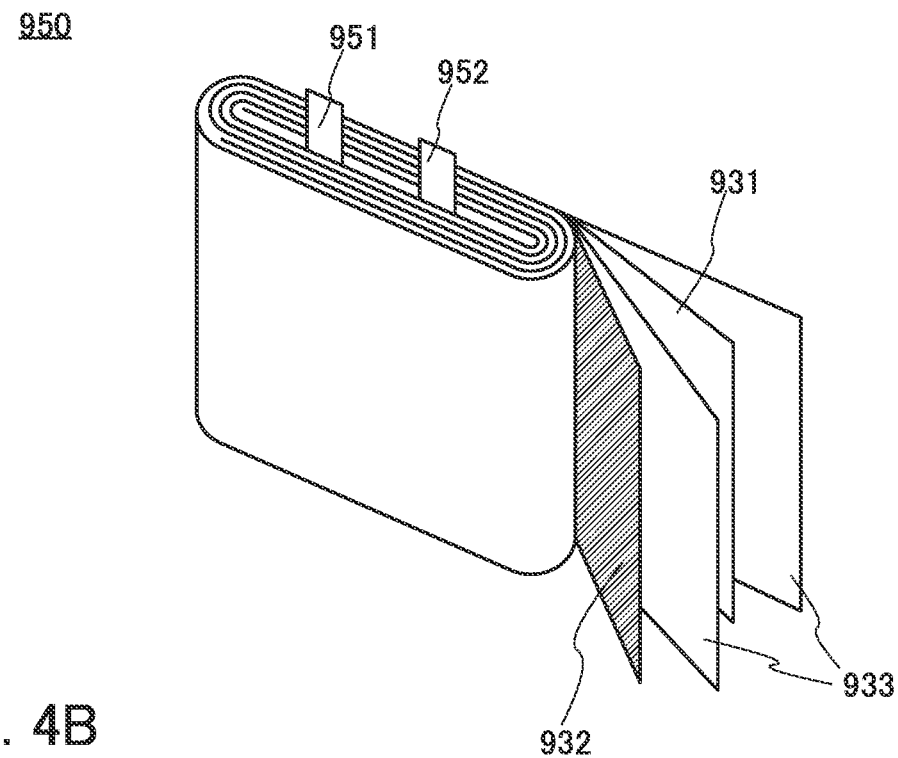
FIG. 4(A) is a diagram illustrating a structure example of a wound body.

FIG. 4(A) illustrates a structural example of the wound body 950. The wound body 950 includes a negative electrode 931, a positive electrode 932, and separators 933. The wound body 950 is a wound body in which the negative electrode 931 is stacked to overlap with the positive electrode 932 with the separator 933 sandwiched therebetween and the sheet of the stack is wound. Note that a plurality of stacks of the negative electrode 931, the positive electrode 932, and the separator 933 may be superimposed.

Figure 4B:
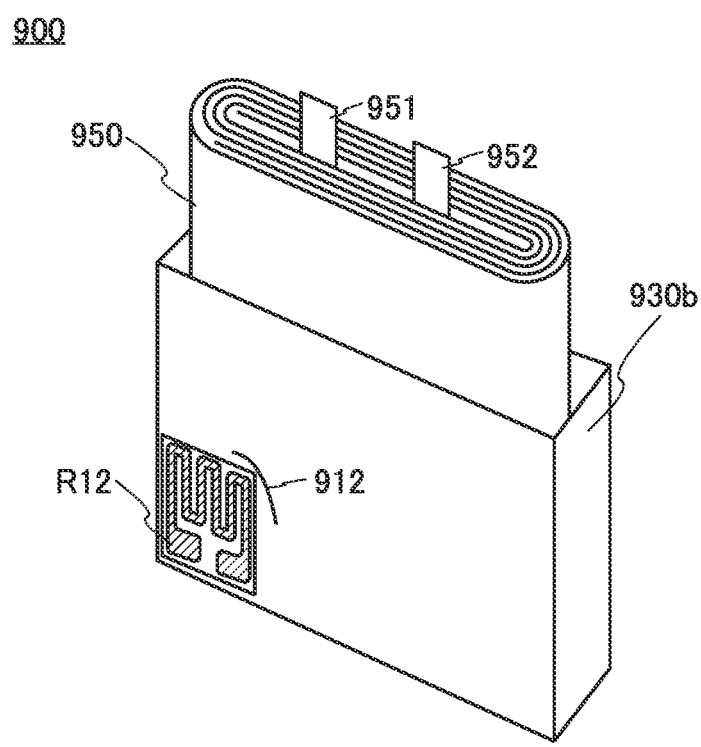
FIG. 4(B) is a schematic diagram in which a strain sensor element is attached to a rectangular secondary battery.

In the case of the rectangular secondary battery 900, a safety valve 912 is provided on a large surface of the housing 930, for example. FIG. 4(B) is a schematic diagram in which the strain sensor element R12 is attached to the rectangular secondary battery 900. Note that the housing 930a is omitted in FIG. 4(B).

The safety valve 912 is made fragile as compared to the other parts of the housing 930 and has a function of releasing the internal pressure of the battery to the outside safely when the internal pressure of the battery increases. Therefore, the vicinity of the safety valve 912 is considerably deformed when the internal pressure of the battery increases. The strain sensor 30 (or the strain sensor element R12) included in the anomaly detection system 100 (or the anomaly detection system 110), which is described in the above embodiment, is preferably attached to the vicinity of the safety valve 912

Note that this embodiment can be implemented in combination with the other embodiments described in this specification as appropriate.

Embodiment 3

In this embodiment, a structure example of a semiconductor device in which an OS transistor is stacked above a transistor formed on a semiconductor substrate will be described.

Figure 5:
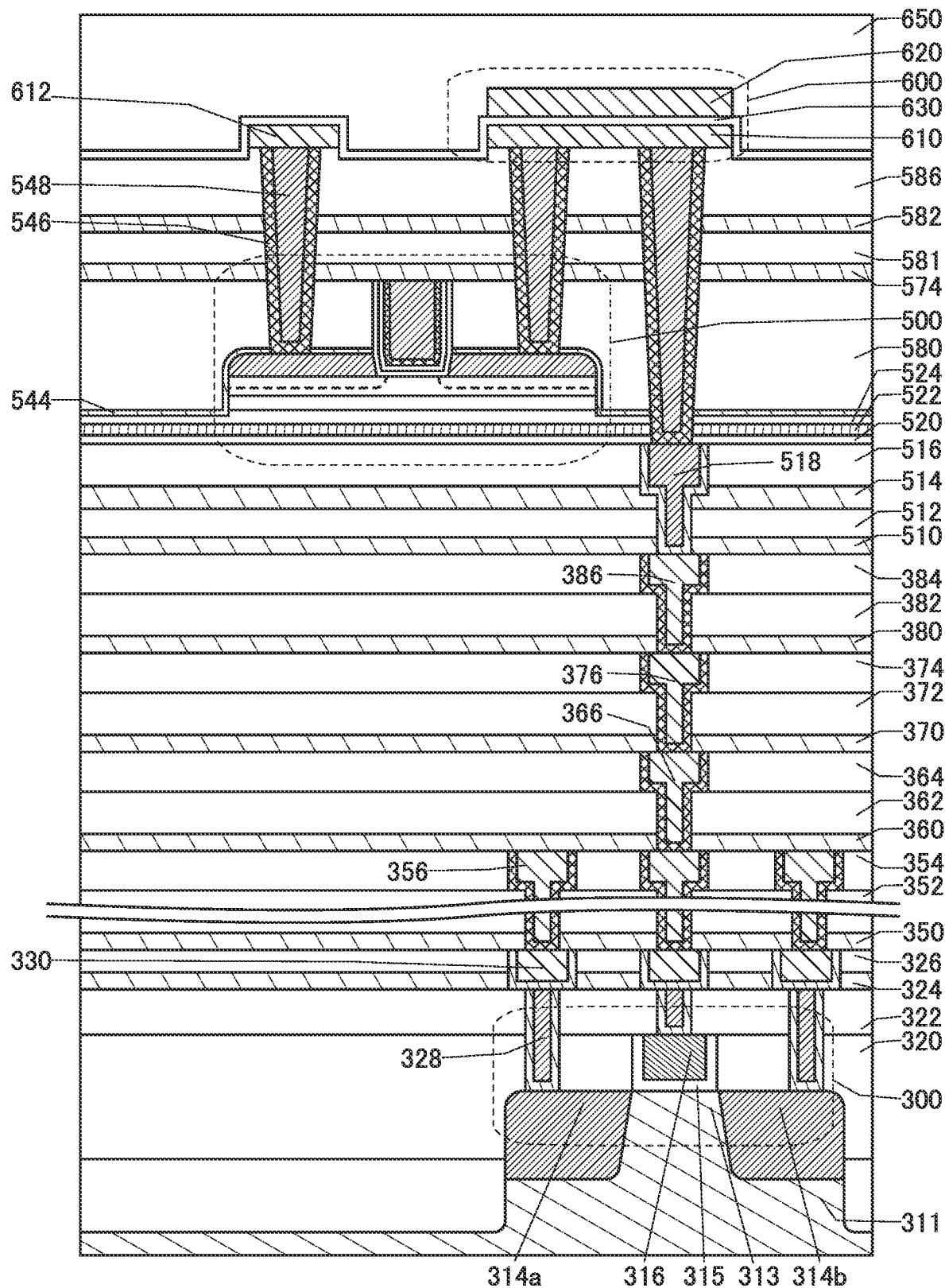
FIG. 5 is a cross-sectional view illustrating a structure example of a semiconductor device.

FIG. 5 illustrates a cross-sectional view of a transistor 300 as the transistor formed on the semiconductor substrate, and a transistor 500 as the OS transistor stacked over the semiconductor substrate.

<Structure Example of Semiconductor Device>

Figure 6A:
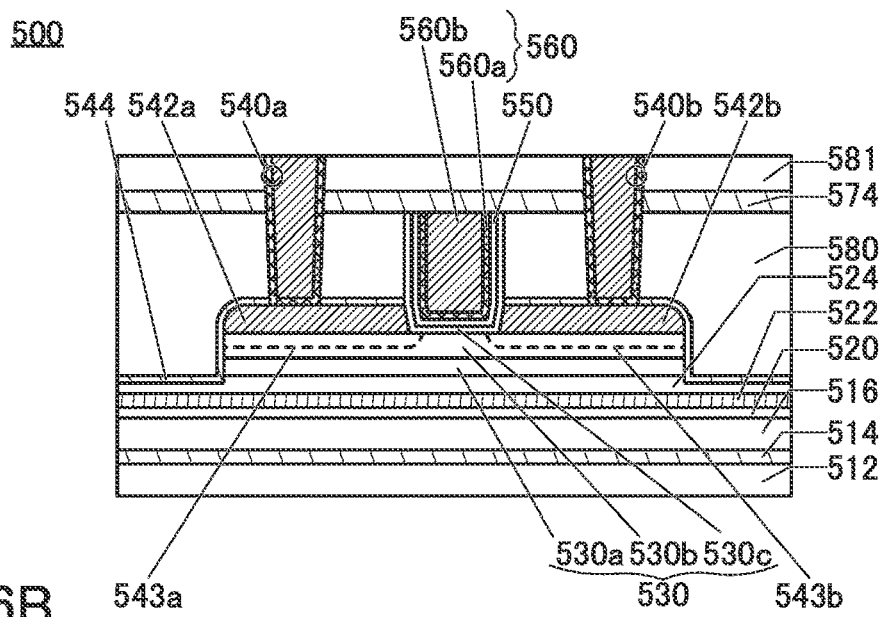
FIGS. 6(A), 6(B), and 6(C) are cross-sectional views illustrating a structure example of a transistor.
Figure 6B:
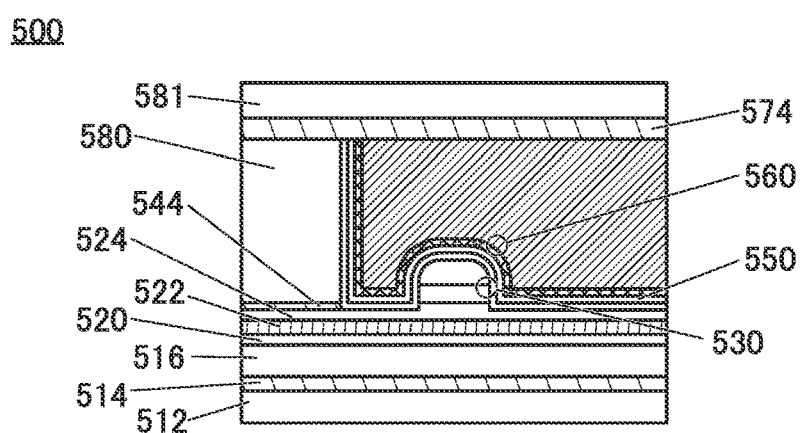

A semiconductor device illustrated in FIG. 5 includes a transistor 300, a transistor 500, and a capacitor 600. FIG. 6(A) is a cross-sectional view of the transistor 500 in the channel length direction, FIG. 6(B) is a cross-sectional view of the transistor 500 in the channel width direction, and FIG. 6(C) is a cross-sectional view of the transistor 300 in the channel width direction.

In the semiconductor device illustrated in FIG. 5, the transistor 500 is provided above the transistor 300, and the capacitor 600 is provided above the transistor 300 and the transistor 500.

The transistor 300 is formed on a substrate 311 and includes a conductor 316, an insulator 315, a semiconductor region 313 that is a part of the substrate 311, and a low-resistance region 314a and a low-resistance region 314b functioning as a source region and a drain region.

Figure 6C:
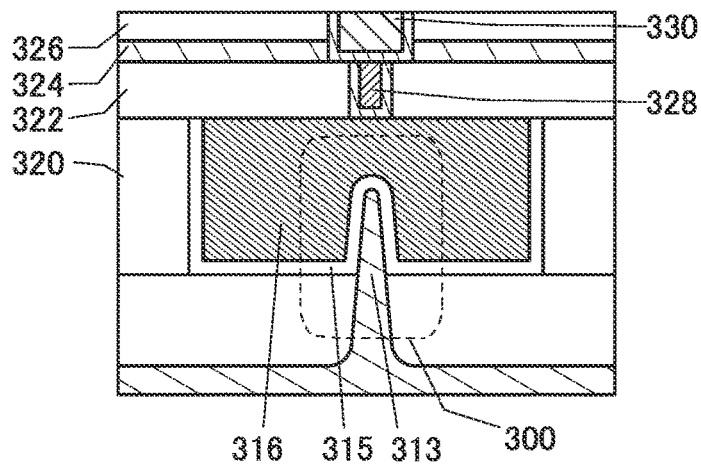

As illustrated in FIG. 6(C), in the transistor 300, the top surface and a side surface in the channel width direction of the semiconductor region 313 are covered with the conductor 316 with the insulator 315 therebetween. The effective channel width is increased in the Fin-type transistor 300, whereby the on-state characteristics of the transistor 300 can be improved. In addition, since contribution of an electric field of the gate electrode can be increased, the off-state characteristics of the transistor 300 can be improved.

Note that the transistor 300 can be a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 illustrated in FIG. 5 is just an example and the structure is not limited thereto; an appropriate transistor can be used in accordance with a circuit structure or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for eliminating a level difference caused by the transistor 300 or the like provided under the insulator 322. For example, a top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 function as a plug or a wiring. A plurality of conductors functioning as plugs or wirings are collectively denoted by the same reference numeral in some cases. Furthermore, in this specification and the like, a wiring and a plug connected to the wiring may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 5, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 and the transistor 500 can be separated by a barrier layer, so that the diffusion of hydrogen from the transistor 300 into the transistor 500 can be inhibited.

Note that for the conductor having a barrier property against hydrogen, tantalum nitride is preferably used, for example. The use of a stack including tantalum nitride and tungsten having high conductivity can inhibit the diffusion of hydrogen from the transistor 300 while the conductivity of a wiring is kept. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 5, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 364 and the conductor 366. For example, in FIG. 5, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 374 and the conductor 376. For example, in FIG. 5, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by a barrier layer, so that the diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for an interlayer film, the parasitic capacitance between wirings can be reduced. Silicon oxide films, silicon oxynitride films, or the like can be used as the insulator 512 and the insulator 516, for example.

A conductor 518 and the like are embedded in the insulator 510, the insulator 512, the insulator 514, and the insulator 516. Note that the conductor 518 functions as a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As illustrated in FIGS. 6(A) and 6(B), the transistor 500 includes an insulator 520 positioned over the insulator 516; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIGS. 6(A) and 6(B), an insulator 544 is preferably positioned between the insulator 580 and the oxide 530a, the oxide 530b, the conductor 542a, and the conductor 542b. In addition, as illustrated in FIGS. 6(A) and 6(B), the conductor 560 preferably includes a conductor 560a provided inside the insulator 550 and a conductor 560b provided inside the conductor 560a. Moreover, as illustrated in FIGS. 6(A) and 6(B), an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be provided. Although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 5 and FIGS. 6(A) and 6(B) is an example, and the structure is not limited thereto; an appropriate transistor can be used in accordance with a circuit structure or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The conductor 560, the conductor 542a, and the conductor 542b are positioned in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The insulator 550 has a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In the case where the insulator 524 includes an excess-oxygen region, it is preferred that the insulator 522 have a function of inhibiting diffusion of oxygen (e.g., an oxygen atom, an oxygen molecule, or the like)(the oxygen is less likely to pass).

When the insulator 522 has a function of inhibiting diffusion of oxygen or impurities, oxygen contained in the oxide 530 is not diffused to the insulator 520 side, which is preferable.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba, Sr)TiO$_3$ (BST). With miniaturization and high integration of transistors, a problem such as leakage current may arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (the oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator which is a high-k material is combined with silicon oxide or silicon oxynitride, the insulator 520 having a stacked-layer structure that has thermal stability and a high dielectric constant can be obtained.

Note that the insulator 520, the insulator 522, and the insulator 524 may each have a stacked-layer structure of two or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic ratio of the element M to the constituent elements in the metal oxide used for the oxide 530a is preferably greater than the atomic ratio of the element M to the constituent elements in the metal oxide used for the oxide 530b. Moreover, the atomic ratio of the element M to In in the metal oxide used for the oxide 530a is preferably greater than the atomic ratio of the element M to In in the metal oxide used for the oxide 530b. Furthermore, the atomic ratio of In to the element M in the metal oxide used for the oxide 530b is preferably greater than the atomic ratio of In to the element M in the metal oxide used for the oxide 530a. A metal oxide that can be used for the oxide 530a or the oxide 530b can be used for the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 6(A), a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. The channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. For example, the insulator 550 is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. Note that the temperature of the film surface in the TDS analysis is preferably within the range of 100° C. to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

When an insulator from which oxygen is released by heating is provided as the insulator 550 in contact with the top surface of the oxide 530c, oxygen can be efficiently supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Although the conductor 560 functioning as a gate electrode has a two-layer structure in FIGS. 6(A) and 6(B), a single-layer structure or a stacked-layer structure of three or more layers may be employed.

For the conductor 560*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560*a* has a function of inhibiting oxygen diffusion, it is possible to prevent a reduction in conductivity of the conductor 560*b* due to oxidation caused by oxygen contained in the insulator 550. As a conductive material having a function of inhibiting oxygen diffusion, for example, tantalum, tantalum nitride, ruthenium, ruthenium oxide, or the like is preferably used.

The conductor 560*b* is preferably formed using a conductive material containing tungsten, copper, or aluminum as its main component. The conductor 560*b* also functions as a wiring and thus is preferably formed using a conductor having high conductivity. For example, a conductive material containing tungsten, copper, or aluminum as its main component can be used. The conductor 560*b* may have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess-oxygen region can be easily formed in a later step, are preferable.

When the insulator 580 from which oxygen is released by heating is provided in contact with the oxide 530*c*, oxygen in the insulator 580 can be efficiently supplied to the oxide 530 through the oxide 530*c*. Note that the concentration of impurities such as water or hydrogen in the insulator 580 is preferably lowered.

The opening of the insulator 580 is formed to overlap with a region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water or hydrogen in the insulator 581 is preferably lowered.

A conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for an interlayer film, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using a material similar to those for the conductor 328 and the conductor 330.

In addition, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are illustrated in FIG. 5, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be reduced and the reliability can be improved in a semiconductor device including a transistor including an oxide semiconductor. Alternatively, a transistor including an oxide semiconductor with a high on-state current can be provided. Alternatively, a transistor including an oxide semiconductor with a low off-state current can be provided. Alternatively, a transistor including an oxide semiconductor and having a high withstand voltage between the source and the drain can be provided.

<Transistor Structure Examples>

Note that the structure of the transistor 500 in the semiconductor device described in this embodiment is not limited to the above. Examples of structures that can be used for the transistor 500 will be described below.

<Transistor Structure Example 1>

Figure 7A:
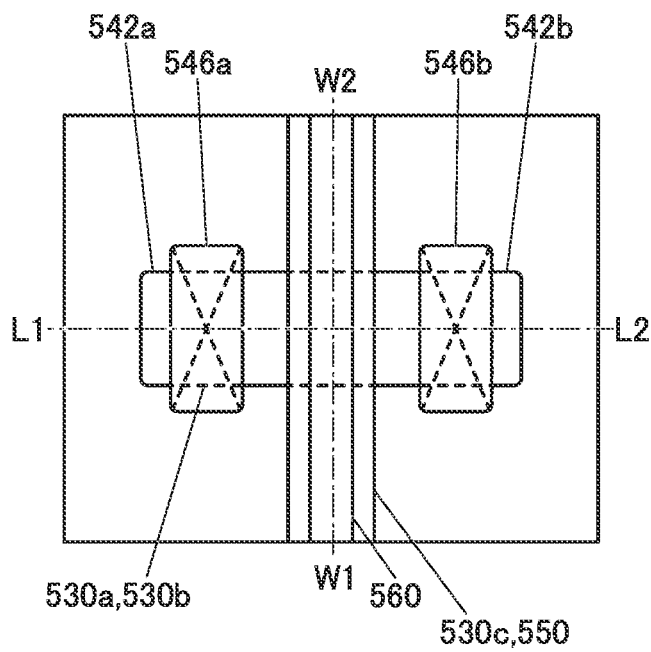
FIG. 7(A) is a top view illustrating a structure example of a transistor.
Figure 7C:
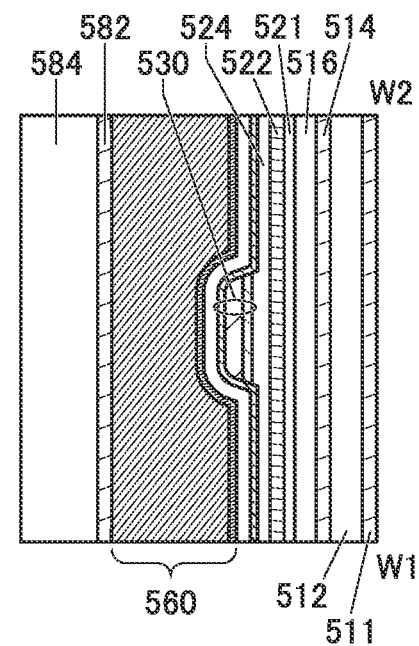
FIGS. 7(B) and 7(C) are cross-sectional views illustrating the structure example of the transistor.
Figure 7B:
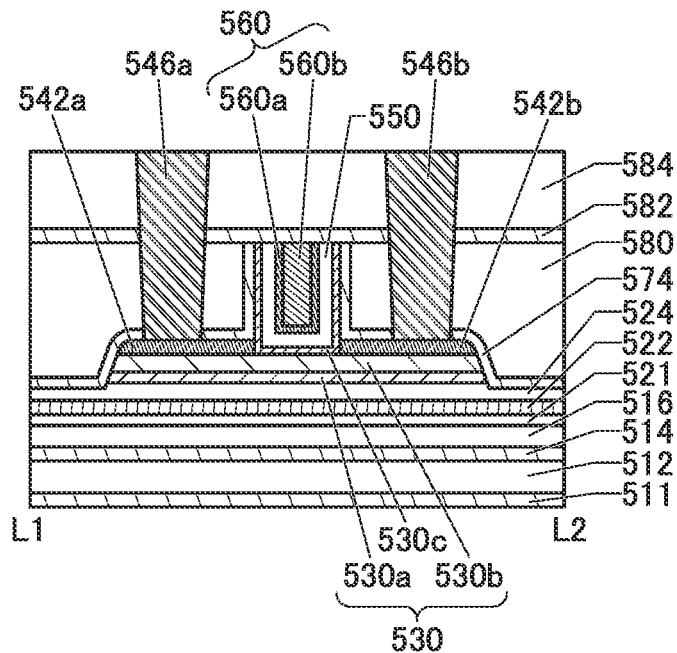

A structure example of a transistor 510A is described with reference to FIGS. 7(A), 7(B), and 7(C). FIG. 7(A) is a top view of the transistor 510A. FIG. 7(B) is a cross-sectional view of a portion indicated by a dashed-dotted line L1-L2 in FIG. 7(A). FIG. 7(C) is a cross-sectional view of a portion indicated by a dashed-dotted line W1-W2 in FIG. 7(A). Note that for clarification of the drawing, some components are not illustrated in the top view of FIG. 7(A).

FIGS. 7(A), 7(B), and 7(C) illustrate a transistor 510A and the insulator 511, the insulator 512, the insulator 514, the insulator 516, the insulator 580, the insulator 582, and an insulator 584 that function as interlayer films. In addition, conductor 546 (a conductor 546a and a conductor 546b) that is electrically connected to the transistor 510A and functions as a contact plug is illustrated.

The transistor 510A includes the conductor 560 (the conductor 560a and the conductor 560b) functioning as a gate electrode; the insulator 550 functioning as a gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 7, the oxide 530c, the insulator 550, and the conductor 560 are positioned in an opening provided in the insulator 580 with the insulator 574 positioned therebetween. Moreover, the oxide 530c, the insulator 550, and the conductor 560 are positioned between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities do not easily pass). Alternatively, it is preferable to use an insulating material that has a function of inhibiting diffusion of oxygen (e.g., at least one of oxygen atoms, oxygen molecules, and the like) (through which the above oxygen does not easily pass). Moreover, aluminum oxide or silicon nitride, for example, may be used for the insulator 511. This structure can inhibit diffusion of impurities such as hydrogen and water to the transistor 510A side from the substrate side through the insulator 511.

For example, the dielectric constant of the insulator 512 is preferably lower than that of the insulator 511. When a material with a low dielectric constant is used for the interlayer film, the parasitic capacitance generated between wirings can be reduced.

In the transistor 510A, the conductor 560 sometimes functions as a gate electrode.

Like the insulator 511 or the insulator 512, the insulator 514 and the insulator 516 function as interlayer films. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side of the insulator 514. Moreover, for example, the insulator 516 preferably has a lower dielectric constant than the insulator 514. When a material with a low dielectric constant is used for the interlayer film, the parasitic capacitance generated between wirings can be reduced.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulating film. When a high-k material is used for an insulator functioning as the gate insulating film, a gate potential during operation of the transistor can be reduced while the physical thickness is maintained.

For example, it is preferable that the insulator 522 be thermally stable. For example, silicon oxide and silicon oxynitride, which have thermal stability, are preferable. In addition, a combination of an insulator of a high-k material and silicon oxide or silicon oxynitride allows the insulator 522 to have a stacked-layer structure with thermal stability and a high dielectric constant.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one kind of metal oxide, can be used.

Note that the oxide 530c is preferably provided in the opening in the insulator 580 with the insulator 574 positioned therebetween. When the insulator 574 has a barrier property, diffusion of impurities from the insulator 580 into the oxide 530 can be inhibited.

One of the conductor 542a and the conductor 542b functions as a source electrode, and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is shown in FIG. 7, a stacked-layer structure of two or more layers may be employed. For example, a tantalum nitride film and a tungsten film may be stacked. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover, or the like may be employed. Note that a transparent conductive material containing indium oxide, tin oxide, or zinc oxide may be used.

A barrier layer may be provided over the conductor 542. The barrier layer is preferably formed using a material having a barrier property against oxygen or hydrogen. This structure can inhibit oxidation of the conductor 542 at the time of deposition of the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a gate insulating film. The insulator 550 is preferably provided in the opening in the insulator 580 with the oxide 530c and the insulator 574 positioned therebetween.

As miniaturization and high integration of transistors progress, a problem such as leakage current may arise because of thinner gate insulating. In that case, the insulator 550 may have a stacked-layer structure. When the insulator functioning as the gate insulating film has a stacked-layer structure of a high-k material and a thermally stable material, a gate potential during operation of the transistor can be reduced while the physical thickness is maintained. Furthermore, the stacked-layer structure can be thermally stable and have a high dielectric constant.

The conductor 560 functioning as a gate electrode includes the conductor 560a and the conductor 560b over the conductor 560a. For the conductor 560a, a conductive material that has a function of inhibiting diffusion of impurities such as a hydrogen atom, a hydrogen molecule, a water molecule, and a copper atom is preferably used. Alternatively, it is preferable to use a conductive material that has a function of inhibiting diffusion of oxygen (e.g., at least one of oxygen atoms, oxygen molecules, and the like). Note that in this specification, a function of inhibiting diffusion of impurities or oxygen means a function of inhibiting diffusion of any one or all of the above impurities and the above oxygen.

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, for example, tantalum, tantalum nitride, ruthenium, or ruthenium oxide is preferably used. For the conductor 560a, the oxide semiconductor that can be used as the oxide 530 can be used. In that case, when the conductor 560b is deposited by a sputtering method, the electric resistance of the conductor 560a can be reduced. The conductor 560a with the reduced electric resistance can be referred to as an OC (Oxide Conductor) electrode.

The conductor 560b is preferably formed using a conductive material containing tungsten, copper, or aluminum as its main component. Since the conductor 560 functions as a wiring, a conductor having high conductivity is preferably used for the conductor 560b. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 function as interlayer films.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower dielectric constant than the insulator 582. When a material with a low dielectric constant is used for the interlayer films, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a conductive material such as a metal material, an alloy material, a metal nitride material, or a metal oxide material can be used as a single layer or stacked layers. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device that includes a transistor including an oxide semiconductor and having a high on-state current can be provided. Alternatively, a semiconductor device that includes a transistor including an oxide semiconductor and having a low off-state current can be provided. Alternatively, a semiconductor device that includes a transistor including an oxide semiconductor and having a high withstand voltage between the source and the drain can be provided. Alternatively, a semiconductor device that has small variations in electrical characteristics, stable electrical characteristics, and high reliability can be provided.

<Transistor Structure Example 2>

Figure 8A:
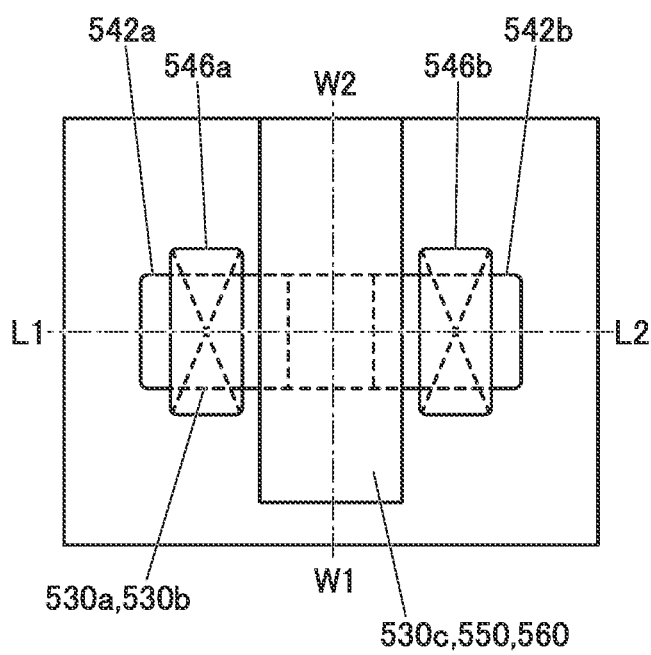
FIG. 8(A) is a top view illustrating a structure example of a transistor.
Figure 8C:
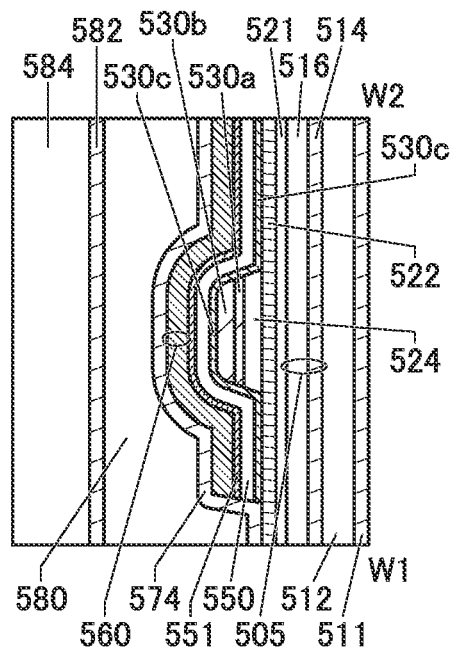
FIGS. 8(B) and 8(C) are cross-sectional views illustrating the structure example of the transistor.
Figure 8B:
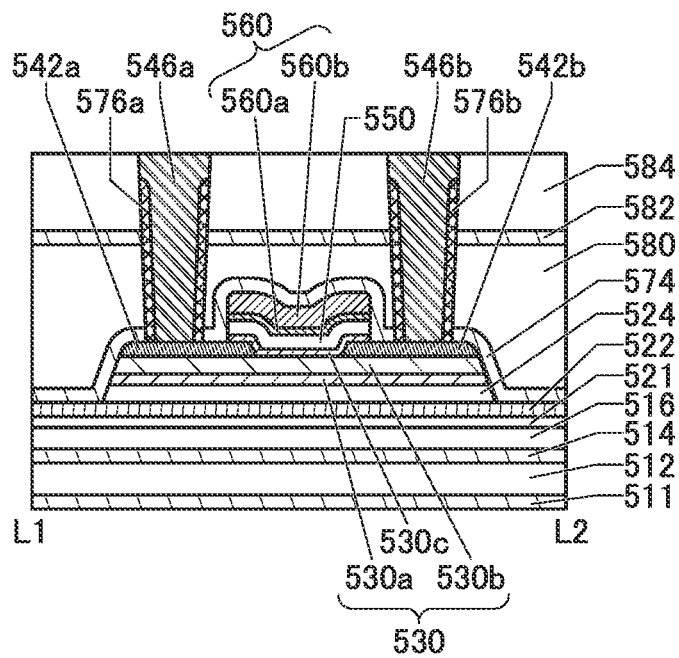

A structure example of a transistor 510B is described with reference to FIGS. 8(A), 8(B), and 8(C). FIG. 8(A) is a top view of the transistor 510B. FIG. 8(B) is a cross-sectional view of a portion indicated by a dashed-dotted line L1-L2 in FIG. 8(A). FIG. 8(C) is a cross-sectional view of a portion indicated by a dashed-dotted line W1-W2 in FIG. 8(A). Note that for clarification of the drawing, some components are not illustrated in the top view of FIG. 8(A).

The transistor 510B is a variation example of the transistor 510A. Therefore, differences from the transistor 510A will be mainly described to avoid repeated description.

The transistor 510B includes a region where the conductor 542 (the conductor 542a and the conductor 542b), the oxide 530c, the insulator 550, and the conductor 560 overlap with each other. With this structure, a transistor with a high on-state current can be provided. Moreover, a transistor with high controllability can be provided.

The conductor 560 functioning as a gate electrode includes the conductor 560a and the conductor 560b over the conductor 560a. The conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and the side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

<Transistor Structure Example 3>

A structure example of a transistor 510C is described with reference to FIGS. 9(A), 9(B), and 9(C). FIG. 9(A) is a top view of the transistor 510C. FIG. 9(B) is a cross-sectional view of a portion indicated by a dashed-dotted line L1-L2 in FIG. 9(A). FIG. 9(C) is a cross-sectional view of a portion indicated by a dashed-dotted line W1-W2 in FIG. 9(A). Note that for clarification of the drawing, some components are not illustrated in the top view of FIG. 9(A).

The transistor 510C is a variation example of the transistor 510A. Therefore, differences from the transistor 510A will be mainly described to avoid repeated description.

In the transistor 510C illustrated in FIG. 9, a conductor 547a is positioned between the conductor 542a and the oxide 530b and a conductor 547b is positioned between the conductor 542b and the oxide 530b. Here, the conductor 542a (the conductor 542b) has a region that extends beyond the top surface and a side surface on the conductor 560 side of the conductor 547a (the conductor 547b) and is in contact with the top surface of the oxide 530b. For the conductors 547, a conductor that can be used for the conductor 542 is used. It is preferable that the thickness of the conductor 547 be at least greater than that of the conductor 542.

In the transistor 510C illustrated in FIG. 9, because of the above structure, the conductor 542 can be closer to the conductor 560 than in the transistor 510A. Alternatively, the conductor 560 and an end portion of the conductor 542a and an end portion of the conductor 542b can overlap with each other. Accordingly, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIG. 9 may have a structure in which an insulator 545 is positioned on and in contact with the insulator 544. The insulator 544 preferably functions as a barrier insulating film that inhibits entry of impurities such as water or hydrogen and excess oxygen into the transistor 510C from the insulator 580 side. The insulator 544 can be formed using an insulator that can be used for the insulator 545. In addition, the insulator 544 may be formed using a nitride insulator such as aluminum nitride, aluminum titanium nitride, titanium nitride, silicon nitride, or silicon nitride oxide, for example.

<Transistor Structure Example 4>

Figure 10A:
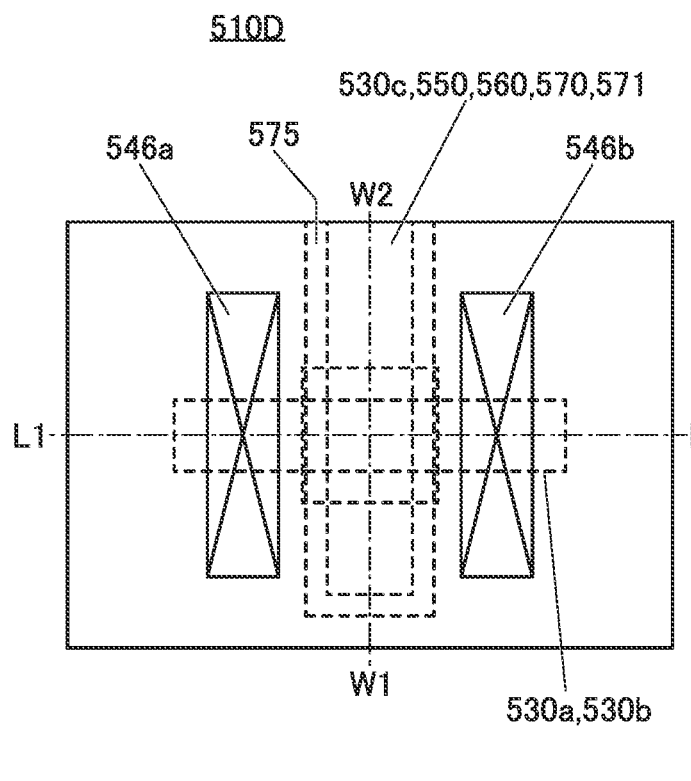
FIG. 10(A) is a top view illustrating a structure example of a transistor.
Figure 10C:
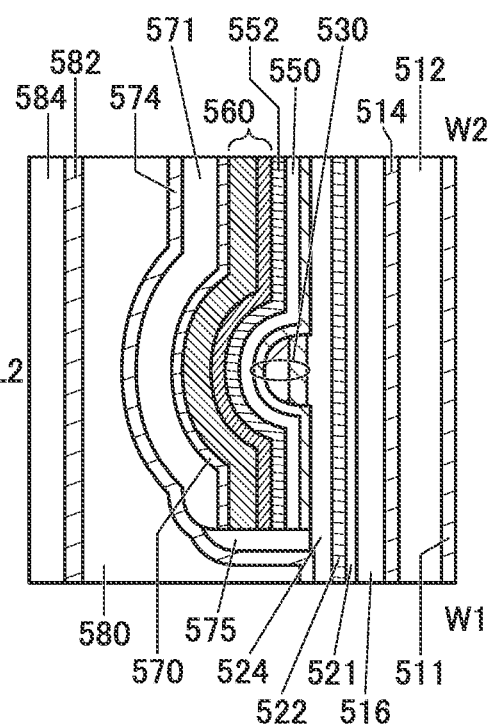
FIGS. 10(B) and 10(C) are cross-sectional views illustrating the structure example of the transistor.
Figure 10B:
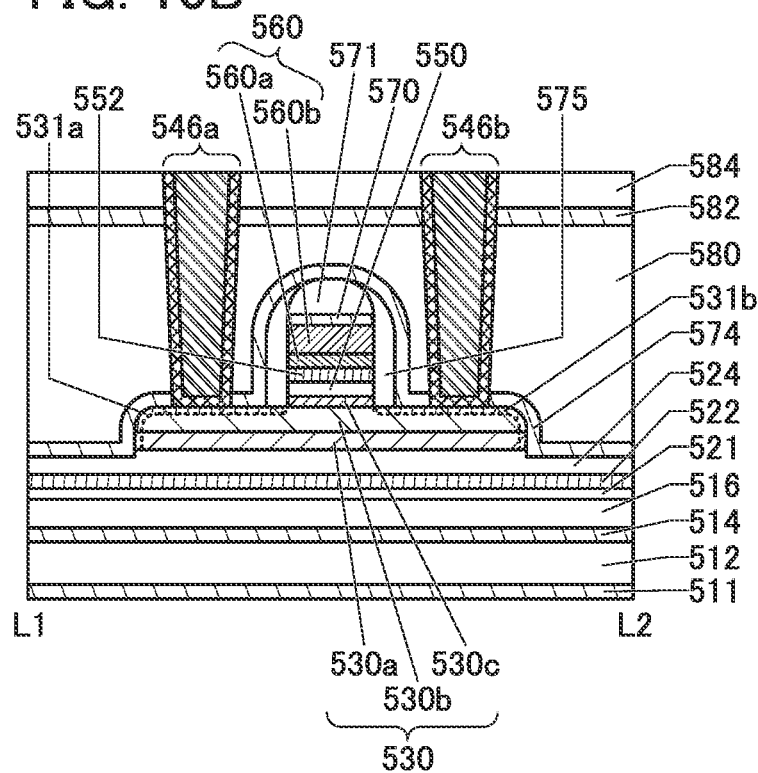

A structure example of a transistor 510D is described with reference to FIGS. 10(A), 10(B), and 10(C). FIG. 10(A) is a top view of the transistor 510D. FIG. 10(B) is a cross-sectional view of a portion indicated by a dashed-dotted line L1-L2 in FIG. 10(A). FIG. 10(C) is a cross-sectional view of a portion indicated by a dashed-dotted line W1-W2 in FIG. 10(A). Note that for clarification of the drawing, some components are not illustrated in the top view of FIG. 10(A).

The transistor 510D is a variation example of the above transistors. Therefore, differences from the above transistors will be mainly described to avoid repeated description.

In FIGS. 10(A) to 10(C), the insulator 550 is provided over the oxide 530c and a metal oxide 552 is provided over the insulator 550. The conductor 560 is provided over the metal oxide 552, and an insulator 570 is provided over the conductor 560. An insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidization of the conductor 560 due to oxygen can be inhibited.

Note that the metal oxide 552 may function as part of a gate electrode. For example, an oxide semiconductor that can be used for the oxide 530 can be used for the metal oxide 552. In this case, when the conductor 560 is deposited by a sputtering method, the metal oxide 552 can have a reduced electric resistance to be a conductive layer. This can be called an OC (Oxide Conductor) electrode.

Note that the metal oxide 552 functions as part of a gate insulating film in some cases. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Thus, a gate potential that is applied during operation of the transistor can be reduced while the physical thickness is maintained. In addition, the equivalent oxide thickness (EOT) of the insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of a gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by heat treatment in a later step. Note that the metal oxide 552 is not an essential structure. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidization of the conductor 560 due to oxygen from above the insulator 570 can be inhibited. Moreover, entry of impurities such as water and hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a surface of the substrate can be greater than or equal to 75° and less than or equal to 100°, preferably greater than or equal to 80° and less than or equal to 95°.

An insulating material having a function of inhibiting the passage of oxygen and impurities such as water and hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to "impurity regions" or "low-resistance regions".

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and a region where the above-described addition of the impurity element is not performed. The offset region can be formed by the above-described addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water and hydrogen can be deposited. For example, aluminum oxide is preferably used for the insulator 574.

Note that an oxide film obtained by a sputtering method may extract hydrogen from the structure body over which the oxide film is deposited. Thus, the hydrogen concentration in the oxide 530 and the insulator 575 can be reduced when the insulator 574 absorbs hydrogen and water from the oxide 530 and the insulator 575.

<Transistor Structure Example 5>

Figure 11A:
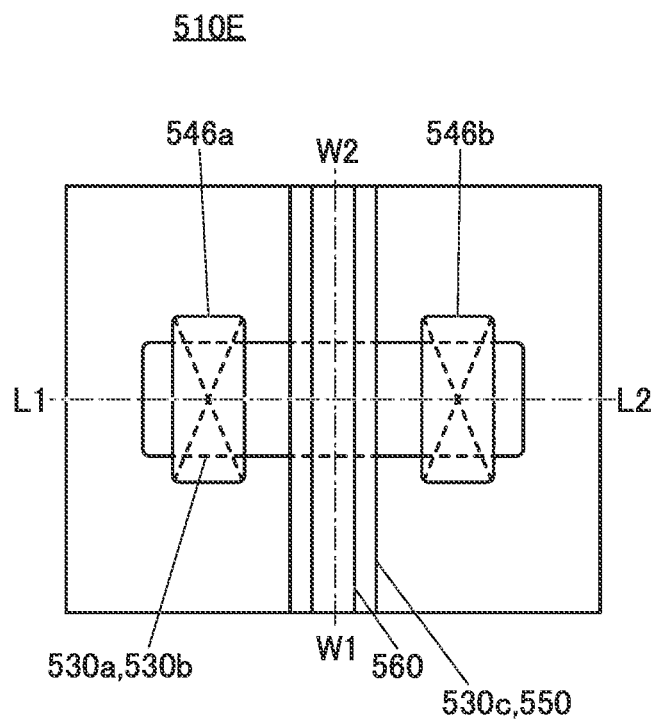
FIG. 11(A) is a top view illustrating a structure example of a transistor.
Figure 11C:
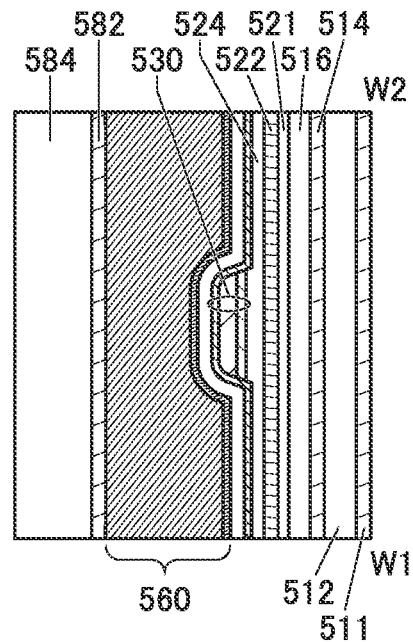
FIGS. 11(B) and 11(C) are cross-sectional views illustrating the structure example of the transistor.
Figure 11B:
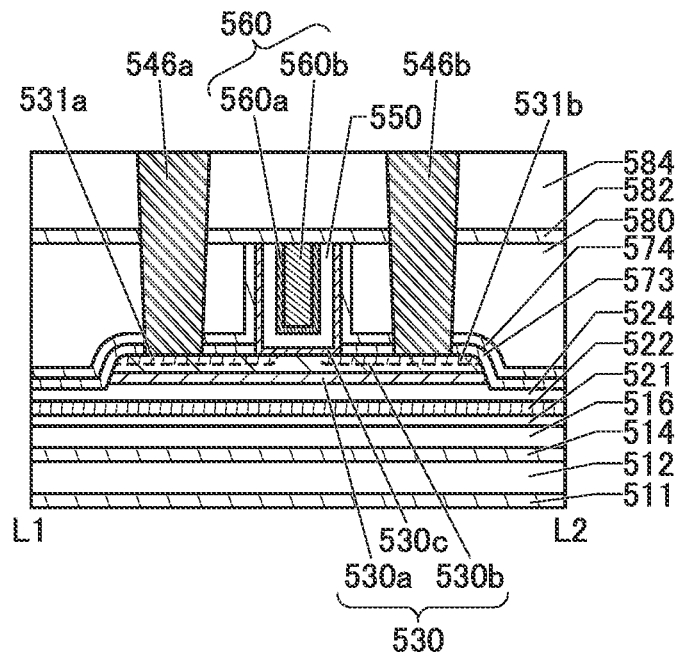

A structure example of a transistor 510E is described with reference to FIG. 11(A) to FIG. 11(C). FIG. 11(A) is a top view of the transistor 510E. FIG. 11(B) is a cross-sectional view of a portion indicated by a dashed-dotted line L1-L2 in FIG. 11(A). FIG. 11(C) is a cross-sectional view of a portion indicated by a dashed-dotted line W1-W2 in FIG. 11(A). Note that for clarification of the drawing, some components are not illustrated in the top view of FIG. 11(A).

The transistor 510E is a variation example of the above transistors. Therefore, differences from the above transistors will be mainly described to avoid repeated description.

In FIGS. 11(A) to 11(C), the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

The regions 531 (the region 531a and the region 531b) illustrated in FIG. 11(B) are regions where an element described below is added to the oxide 530b. The regions 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530b that are not overlapped by the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530b are boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulator 573 and an insulating film to be the insulator 574 may be formed over the oxide 530b and the dummy gate. Stacking the insulating film to be the insulator 573 and the insulating film to be the insulator 574 can provide a region where the region 531, the oxide 530c, and the insulator 550 overlap with each other.

Specifically, after an insulating film to be the insulator 580 is provided over the insulating film to be the insulator 574, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening provided in the insulator 580, and the region 531 provided in the oxide 530b is partly exposed at the bottom surface of the opening. Next, an oxide film to be the oxide 530c, an insulating film to be the insulator 550, and a conductive film to be the conductor 560 are formed in this order in the opening, and then an oxide film to be the oxide 530c, an insulating film to be the insulator 550, and a conductive film to be the conductor 560 are partly removed by CMP treatment or the like until the insulator 580 is exposed; thus, the transistor illustrated in FIG. 11 can be formed.

Note that the insulator 573 and the insulator 574 are not essential components. Design is appropriately set in consideration of required transistor characteristics.

The cost of the transistor illustrated in FIG. 11 can be reduced because an existing apparatus can be used and the conductor 542 is not provided.

<Transistor Structure Example 6>

Although FIG. 5 and FIG. 6 illustrate a structure example in which the conductor 560 that functions as a gate is formed in an opening of the insulator 580, a structure in which the insulator is provided above the conductor can be employed, for example. A structure example of such a transistor is illustrated in FIG. 12 and FIG. 13.

Figure 12A:
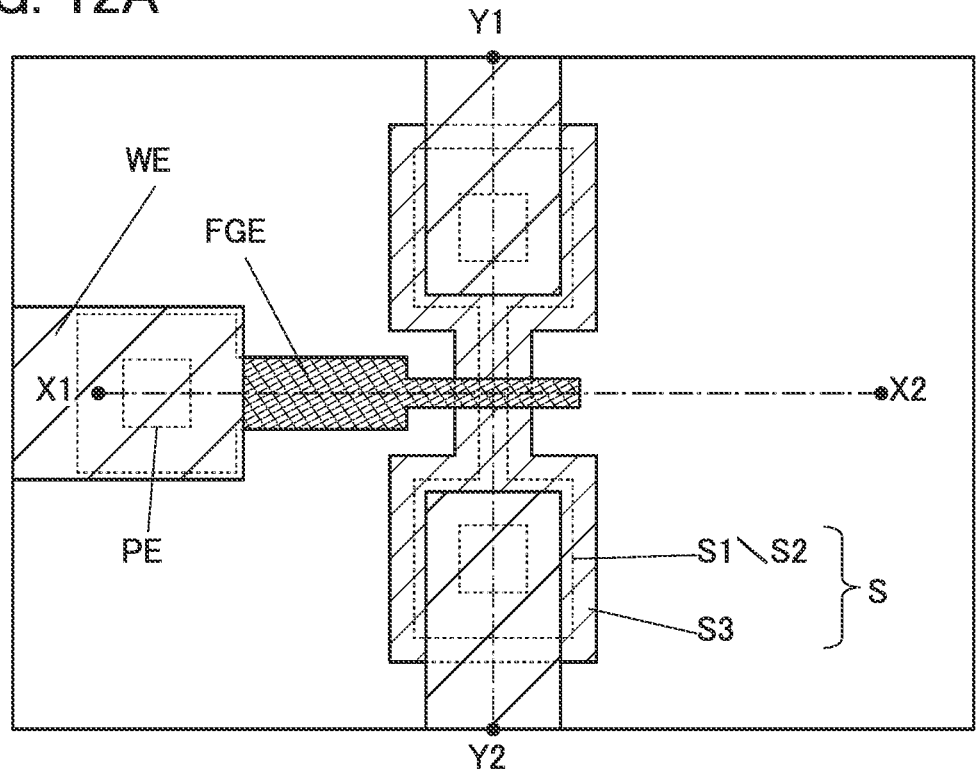
FIG. 12(A) is a top view illustrating a structure example of a transistor.
Figure 12B:
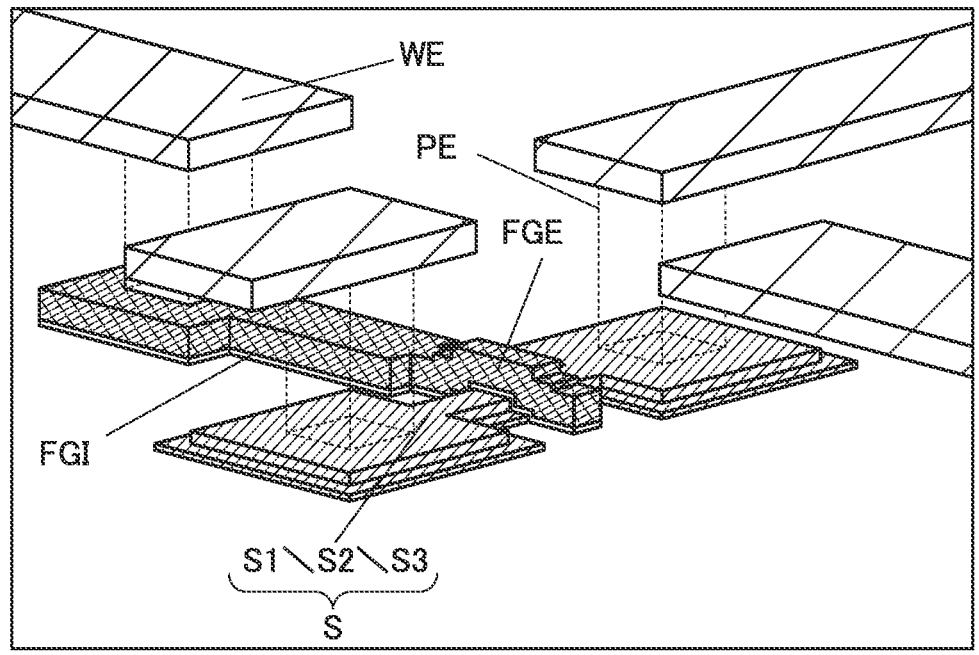
FIG. 12(B) is a perspective view illustrating the structure example of the transistor.
Figure 13A:
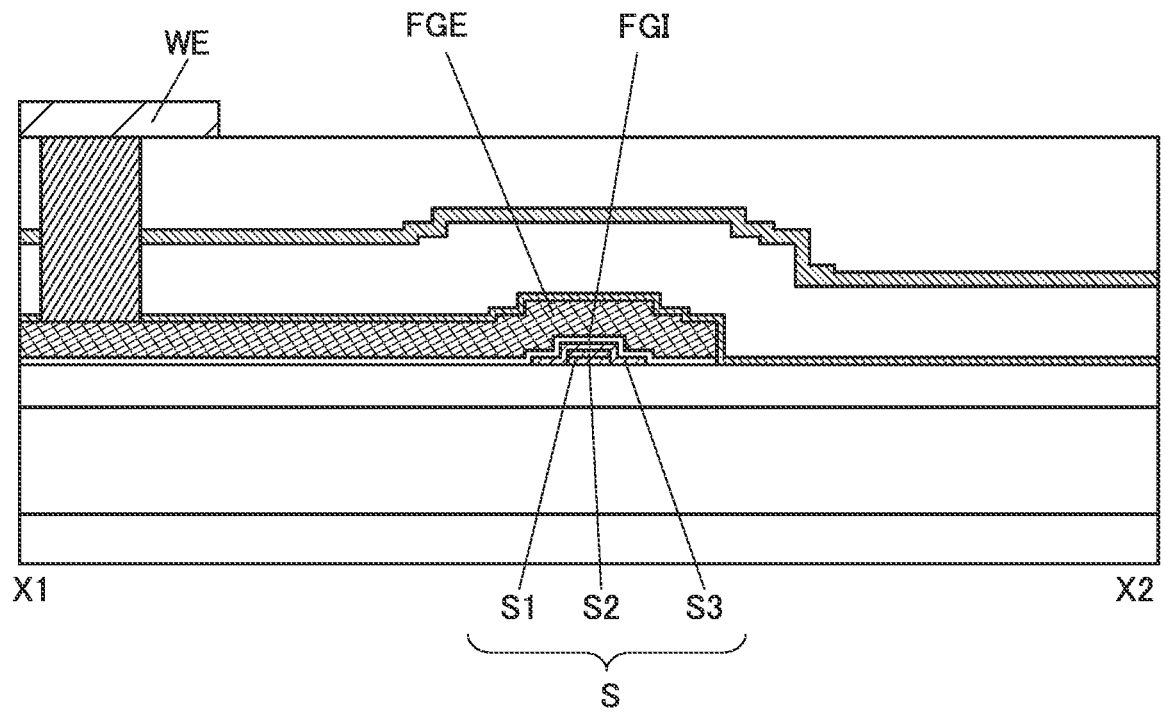
FIGS. 13(A) and 13(B) are cross-sectional views illustrating a structure example of a transistor.
Figure 13B:
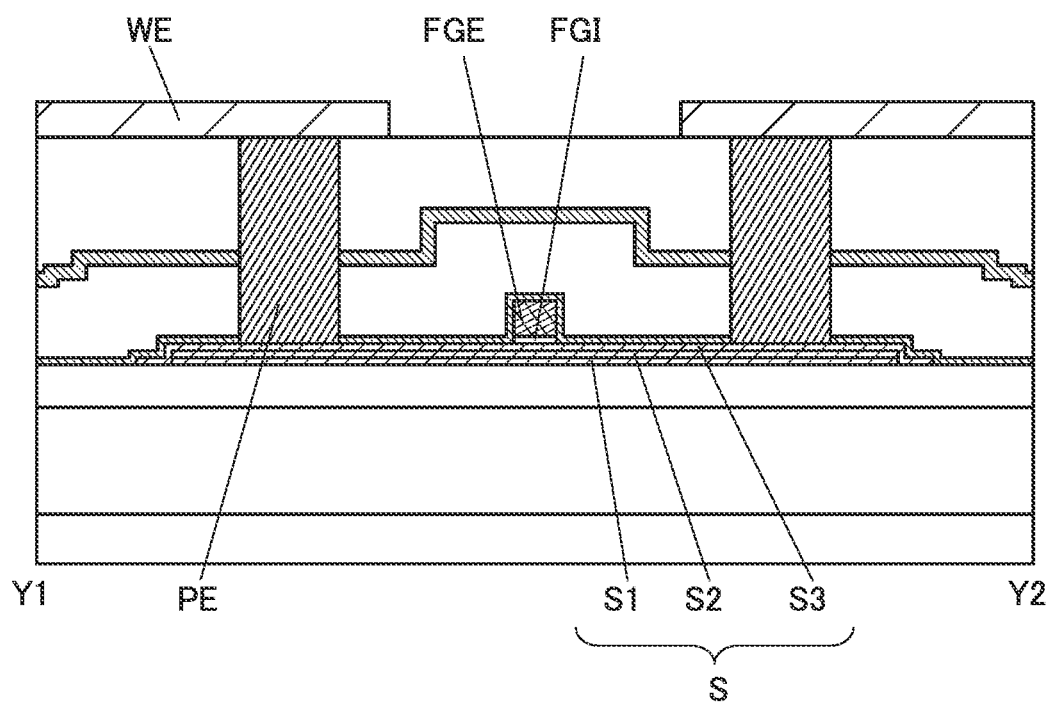

FIG. 12(A) is a top view of a transistor and FIG. 12(B) is a perspective view of the transistor. FIG. 13(A) is a cross-sectional view taken along X1-X2 in FIG. 12(A), and FIG. 13(B) is a cross-sectional view taken along Y1-Y2 in FIG. 12(A).

The transistor illustrated in FIG. 12 and FIG. 13 includes a conductor BGE having a function of a back gate, an insulator BGI having a function of a gate insulating film, an oxide semiconductor S, an insulator FGI having a function of a gate insulating film, a conductor FGE having a function of a front gate, and a conductor WE having a function of a wiring. A conductor PE has a function of a plug for connecting the conductor WE to the oxide S or the conductor FGE. Note that an example in which the oxide semiconductor S includes three layers of oxides S1, S2, and S3 is shown here.

Note that this embodiment can be implemented in combination with the other embodiments described in this specification as appropriate.

Embodiment 4

In this embodiment, the composition of a metal oxide that can be used in the OS transistor described in the above embodiment will be described.

<Composition of Metal Oxide>

Note that in this specification and the like, CAAC (c-axis aligned crystal) and CAC (cloud-aligned composite) might be stated. Note that CAAC refers to an example of a crystal structure, and CAC refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current driving capability, that is, high on-state current and high field-effect mobility.

In other words, the CAC-OS or the CAC-metal oxide can also be referred to as a matrix composite or a metal matrix composite.

<Structure of Metal Oxide>

Oxide semiconductors are classified into a single-crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

As an oxide semiconductor used for a semiconductor of the transistor, a thin film having high crystallinity is preferably used. With the use of the thin film, the stability or the reliability of the transistor can be improved. Examples of the thin film include a thin film of a single-crystal oxide semiconductor and a thin film of a polycrystalline oxide semiconductor. However, for forming the thin film of a single-crystal oxide semiconductor or the thin film of a polycrystalline oxide semiconductor over a substrate, a high-temperature process or a laser beating process is needed. Thus, the manufacturing cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an ne structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO with a size of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor depending on the analysis method.

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

Note that when the above oxide semiconductor is used for a transistor, the transistor having high field-effect mobility can be achieved. In addition, the transistor having high reliability can be achieved.

Non-Patent Document 6 shows that the transistor using an oxide semiconductor has an extremely low leakage current in a non-conduction state; specifically, the off-state current per micrometer in the channel width of the transistor is of the order of yA/μm ($10^{-24}$ A/μm). For example, a low-power-consumption CPU utilizing a characteristic of a low leakage current of the transistor using an oxide semiconductor is disclosed (see Non-Patent Document 7).

Furthermore, application of a transistor using an oxide semiconductor to a display device that utilizes the characteristic of a low leakage current of the transistor has been reported (see Non-Patent Document 8). In the display device, a displayed image is changed several tens of times per second. The number of times an image is changed per second is called a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

Furthermore, an oxide semiconductor with a low carrier density is preferably used for the transistor. In the case where the carrier density of an oxide semiconductor film is reduced, the impurity concentration in the oxide semiconductor film is reduced to reduce the density of defect states. In this specification and the like, a state with a low impurity concentration and a low density of defect states is referred to as a highly purified intrinsic or substantially highly purified intrinsic state. For example, an oxide semiconductor has a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Moreover, a highly purified intrinsic or substantially highly purified intrinsic oxide semiconductor film has a low density of defect states and accordingly may have a low density of trap states.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of the transistor, it is effective to reduce the concentration of impurities in the oxide semiconductor. In addition, in order to reduce the concentration of impurities in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2\times10^{18}$ atoms/cm, preferably lower than or equal to $2\times10^{17}$ atoms/cm$^3$.

When the oxide semiconductor contains an alkali metal or an alkaline earth metal, defect states are formed and carriers are generated, in some cases. Thus, a transistor using an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of an alkali metal or an alkaline earth metal in the oxide semiconductor obtained by SIMS is set to lower than or equal to $1\times10^{18}$ atoms/cm$^3$, preferably lower than or equal to $2\times10^{16}$ atoms/cm$^3$.

Furthermore, when containing nitrogen, the oxide semiconductor easily becomes n-type by generation of electrons serving as carriers and an increase in carrier density. As a result, a transistor using an oxide semiconductor containing nitrogen as a semiconductor is likely to have normally-on characteristics. Thus, nitrogen in the oxide semiconductor is preferably reduced as much as possible; for example, the nitrogen concentration in the oxide semiconductor is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ in SIMS.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurities is used for a channel formation region of a transistor, stable electrical characteristics can be given.

The discovery of the CAAC structure and the nc structure has contributed to an improvement in electrical characteristics and reliability of a transistor using an oxide semiconductor having the CAAC structure or the nc structure, a reduction in manufacturing cost, and an improvement in throughput. Furthermore, applications of the transistor to a display device and an LSI utilizing the characteristics of a low leakage current of the transistor have been studied.

Note that this embodiment can be implemented in combination with the other embodiments described in this specification as appropriate.

Embodiment 5

In this embodiment, examples of electronic devices each of which includes a secondary battery and the anomaly detection system described in the above embodiment will be described.

Figure 14A:
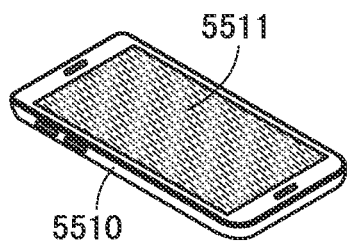
FIGS. 14(A), 14(B), 14(C), and 14(D) are diagrams illustrating examples of electronic devices.

For example, the anomaly detection system 100 (or the anomaly detection system 110) can be used in an information terminal 5500 (see FIG. 14(A)). The information terminal 5500 is a cellular phone (smartphone). The information terminal 5500 includes a housing 5510 and a display unit 5511, and a touch panel is provided in the display unit 5511 and a button is provided in the housing 5510 as input interfaces.

Figure 14B:
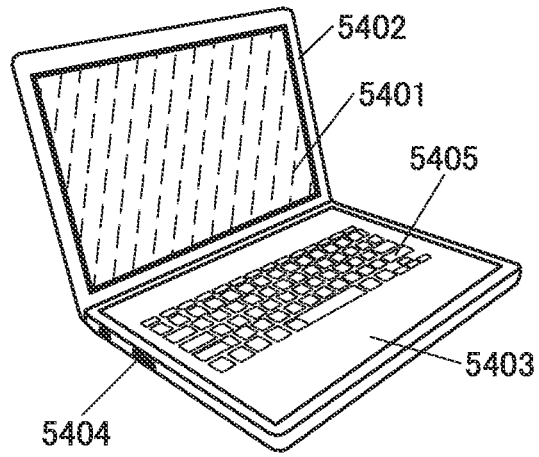

For example, the anomaly detection system 100 (or the anomaly detection system 110) can be used in a laptop personal computer 5400 (see FIG. 14(B)). The personal computer 5400 includes a display unit 5401, a housing 5402, a touch pad 5403, a connection port 5404, and the like.

The touch pad 5403 functions as an input unit such as a pointing device or a pen tablet and can be controlled with a finger, a stylus, or the like. Furthermore, a display element is incorporated in the touch pad 5403. As illustrated in FIG. 14(B), when an input key 5405 is displayed on a surface of the touch pad 5403, the touch pad 5403 can be used as a keyboard. A vibration module may be incorporated in the touch pad 5403 so that sense of touch is achieved by vibration when a user touches the input key 5405.

Figure 14C:
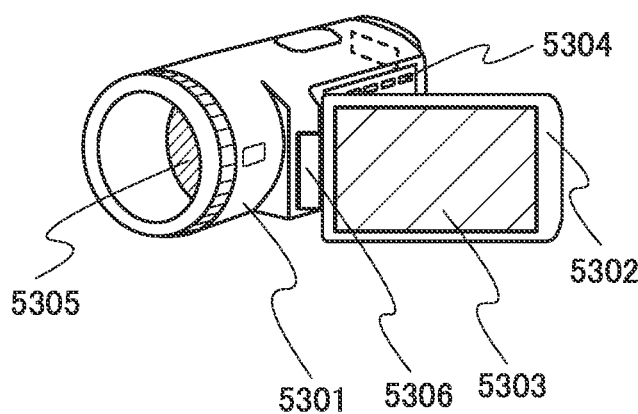

For example, the anomaly detection system 100 (or the anomaly detection system 110) can be used in a video camera 5300 (see FIG. 14(C)). The video camera 5300 includes a first housing 5301, a second housing 5302, a display unit 5303, operation buttons 5304, a lens 5305, a joint 5306, and the like. The operation buttons 5304 and the lens 5305 are provided in the first housing 5301, and the display unit 5303 is provided in the second housing 5302.

Figure 14D:
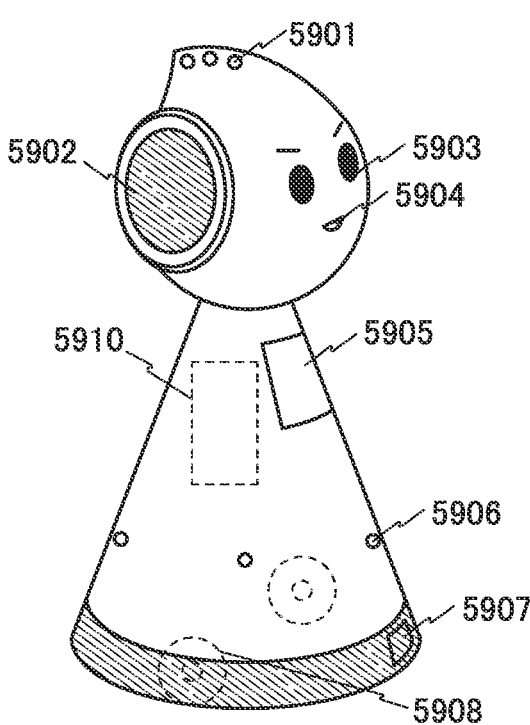

For example, the anomaly detection system 100 (or the anomaly detection system 110) can be used in a robot 5900 (see FIG. 14(D)). The robot 5900 includes an arithmetic device 5910, an illuminance sensor 5901, a microphone 5902, an upper camera 5903, a speaker 5904, a display 5905, a lower camera 5906, an obstacle sensor 5907, a moving mechanism 5908, and the like.

The upper camera 5903 and the lower camera 5906 each have a function of taking an image of the surroundings of the robot 5900. The obstacle sensor 5907 can detect the presence of an obstacle when the robot 5900 moves with the moving mechanism 5908. The robot 5900 can move safely by recognizing the surroundings with the upper camera 5903, the lower camera 5906, and the obstacle sensor 5907.

Figure 15:
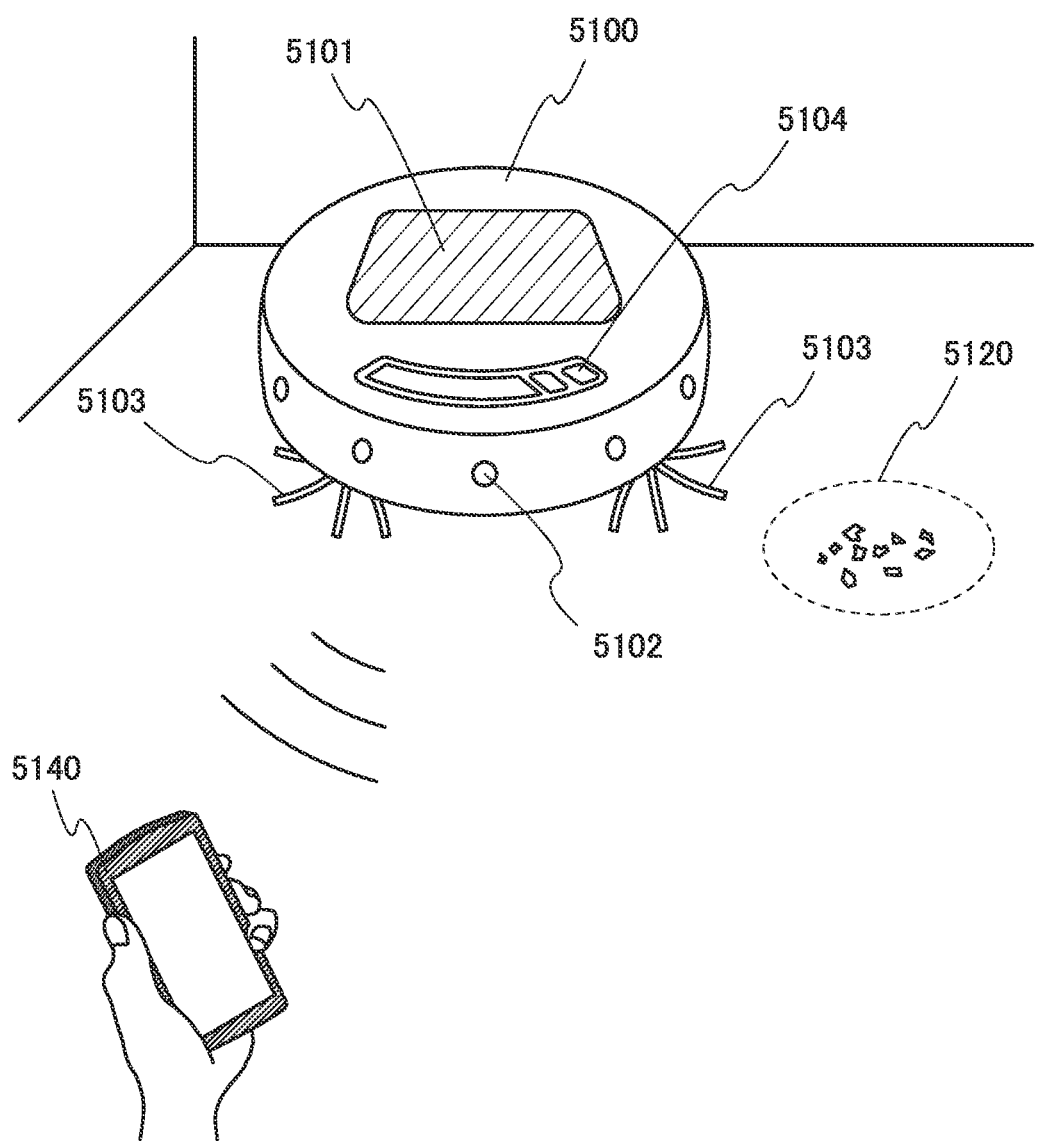
FIG. 15 is diagrams illustrating examples of electronic devices.

For example, the anomaly detection system 100 (or the anomaly detection system 110) can be used in a cleaning robot 5100 (see FIG. 15). The cleaning robot 5100 includes a display 5101 placed on its top surface, a plurality of cameras 5102 placed on its side surface, a brush 5103, operation buttons 5104, and the like.

Although not illustrated, the bottom surface of the cleaning robot 5100 is provided with a tire, an inlet, and the like. The cleaning robot 5100 further includes various sensors such as an infrared sensor, an ultrasonic sensor, an acceleration sensor, a piezoelectric sensor, an optical sensor, and a gyroscope sensor. In addition, the cleaning robot 5100 has a wireless communication means.

The cleaning robot 5100 is self-propelled, detects dust 5120, and sucks up the dust 5120 through the inlet provided on the bottom surface. The cleaning robot 5100 can judge whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped. The display 5101 can display the amount of power storage of a secondary battery (also referred to as a battery), the amount of collected dust, and the like.

The cleaning robot 5100 can communicate with an information terminal 5140 such as a smartphone. The information terminal 5140 can display images taken by the cameras 5102. Accordingly, an owner of the cleaning robot 5100 can monitor the room even from the outside.

Figure 16A:
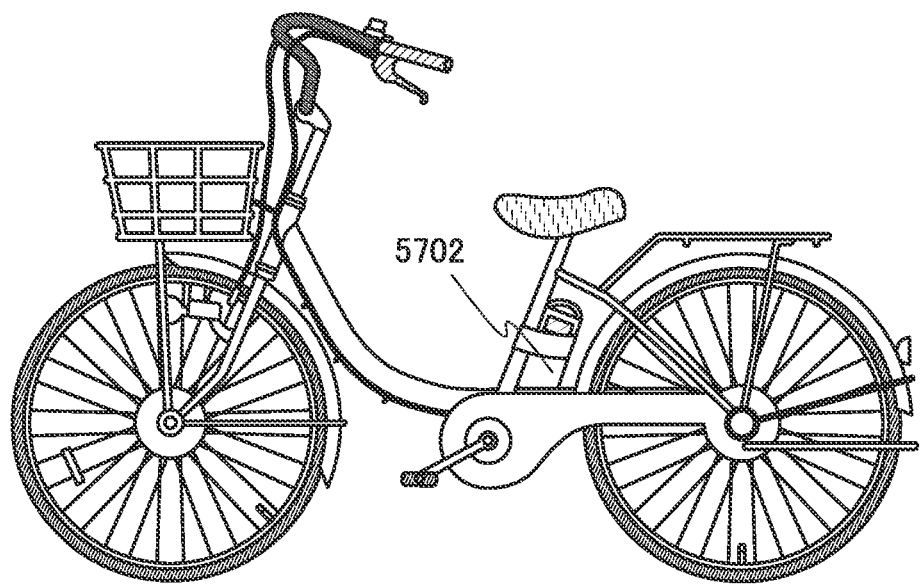
FIGS. 16(A) and 16(B) are diagrams illustrating examples of electronic devices.
Figure 16B:
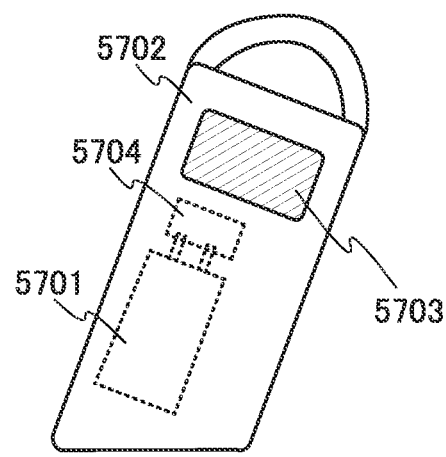

For example, the anomaly detection system 100 (or the anomaly detection system 110) can be used in an electric bicycle 5700 (see FIG. 16(A)). The electric bicycle 5700 includes a power storage system 5702 and the like. The power storage system 5702 supplies electric power to a motor that assists a rider of the electric bicycle 5700, so that the rider can pedal with less force. The power storage system 5702 is portable, and FIG. 16(B) illustrates the state where the power storage system 5702 is detached from the electric bicycle 5700.

The power storage system 5702 incorporates a plurality of secondary batteries 5701, and a display unit 5703 can display the amount of power storage or the like. The power storage system 5702 includes a control circuit 5704, and the control circuit 5704 is connected to the secondary battery 5701. The anomaly detection system 100 (or the anomaly detection system 110) described in the above embodiment can be used as a part of the control circuit 5704.

As described above, the anomaly detection system 100 (or the anomaly detection system 110) described in the above embodiment can be used in a variety of electronic devices including secondary batteries. In recent years, a variety of features such as small size, lightweight, high output, high capacity, high-speed charging, and adaptability to a wide range of environmental temperatures have been required for secondary batteries included in electronic devices, and such features of the secondary batteries have become factors that influence the attractiveness of the electronic devices including the secondary batteries. On the other hand, it is an important challenge involving the reliability of electronic devices to ensure the safety of secondary batteries. With the use of the anomaly detection system 100 (or the anomaly detection system 110) described in the above embodiment, an electronic device with high safety can be provided.

Note that this embodiment can be implemented in combination with the other embodiments described in this specification as appropriate.

REFERENCE NUMERALS

C11: capacitor, N11: node, N12: node, N13: node, R11: resistor, R12: strain sensor element, S1: oxide, T11: transistor, 30: strain sensor, 40: memory, 50: comparator, 60: oscillator circuit, 70: circuit, 100: anomaly detection system, 110: anomaly detection system, 200: secondary battery, 201: positive electrode cap, 202: battery can, 203: positive electrode terminal, 204: positive electrode, 205: separator, 206: negative electrode, 207: negative electrode terminal, 208: insulating plate, 209: insulating plates, 211: PTC element, 212: safety valve, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 510: insulator, 510A: transistor, 510B: transistor, 510C: transistor, 510D: transistor, 510E: transistor, 511: insulator, 512: insulator, 514: insulator, 516: insulator, 518: conductor, 520: insulator, 522: insulator, 524: insulator, 530: oxide, 530a: oxide, 530b: oxide, 530c: oxide, 531: region, 531a: region, 531b: region, 540a: conductor, 540b: conductor, 542: conductor, 542a: conductor, 542b: conductor, 543: region, 543a: region, 543b: region, 544: insulator, 545: insulator, 546: conductor, 546a: conductor, 546b: conductor, 547: conductor, 547a: conductor, 547b: conductor, 548: conductor, 550: insulator, 552: metal oxide, 560: conductor, 560a: conductor, 560b: conductor, 570: insulator, 571: insulator, 573: insulator, 574: insulator, 575: insulator, 576: insulator, 576a: insulator, 576b: insulator, 580: insulator, 581: insulator, 582: insulator, 584: insulator, 586: insulator, 600: capacitor, 610: conductor, 612: conductor, 620: conductor, 630: insulator, 650: insulator, 900: secondary battery, 912: safety valve, 930: housing, 930a: housing, 930b: housing, 931: negative electrode, 932: positive electrode, 933: separator, 950: wound body, 951: terminal, 952: terminal, 5100: cleaning robot, 5101: display, 5102: camera, 5103: brush, 5104: operation button, 5120: dust, 5140: information terminal 5140, 5300: video camera, 5301: housing, 5302: housing, 5303: display unit, 5304: operation button, 5305: lens, 5306: joint, 5400: personal computer, 5401: display unit, 5402: housing, 5403: touch pad, 5404: connection port, 5405: input key, 5500: information terminal, 5510: housing, 5511: display unit, 5700: electric bicycle, 5701: secondary battery, 5702: power storage system, 5703: display unit, 5704: control circuit, 5900: robot, 5901: illuminance sensor, 5902: microphone, 5903: upper camera, 5904: speaker, 5905: display, 5906: lower camera, 5907: obstacle sensor, 5908: moving mechanism, 5910: arithmetic device

The invention claimed is:

1. An anomaly detection system comprising:
a strain sensor;
a memory; and
a comparator,
wherein the memory is configured to retain an analog potential,
wherein the comparator is configured to compare a first potential output by the strain sensor and a second potential retained by the memory,
wherein the anomaly detection system is configured to:
retain the first potential in the memory as an initialization operation in a first case where the second potential is higher than the first potential; and
output an anomaly detection signal in a second case where the second potential is lower than the first potential by a predetermined value or more.

2. The anomaly detection system according to claim 1,
wherein the strain sensor comprises a resistor and a strain sensor element, and
wherein the strain sensor element is attached to a secondary battery.

3. The anomaly detection system according to claim 1, further comprising:
an oscillation circuit; and
a counter circuit,
wherein the oscillation circuit is configured to oscillate an AC signal in the second case,
wherein the counter circuit is configured to count a number of oscillations of the AC signal, and
wherein an anomaly detection signal is configured to be output when the number of oscillations reaches a predetermined number of times.

4. The anomaly detection system according to claim 1,
wherein the memory comprises a transistor and a capacitor, and
wherein the transistor comprises a metal oxide in a channel formation region.

5. An anomaly detection system comprising:
a strain sensor;
a memory; and
a comparator,
wherein the memory is configured to retain an analog potential,
wherein the comparator is configured to compare a first potential output by the strain sensor and a second potential retained by the memory,
wherein the anomaly detection system is configured to:
retain the first potential as an initialization operation in a first case where one of the first potential and the second potential is higher than the other of the first potential and the second potential; and
output an anomaly detection signal in a second case where the one of the first potential and the second potential is lower than the other of the first potential and the second potential by a predetermined value or more.

6. The anomaly detection system according to claim 5, wherein the one of the first potential and the second potential is the first potential.

7. The anomaly detection system according to claim 5,
wherein the strain sensor comprises a resistor and a strain sensor element, and
wherein the strain sensor element is attached to a secondary battery.

8. The anomaly detection system according to claim 5, further comprising:
an oscillation circuit; and
a counter circuit,
wherein the oscillation circuit is configured to oscillate an AC signal in the second case,
wherein the counter circuit is configured to count a number of oscillations of the AC signal, and
wherein an anomaly detection signal is configured to be output when the number of oscillations reaches a predetermined number of times.

9. The anomaly detection system according to claim 5,
wherein the memory comprises a transistor and a capacitor, and
wherein the transistor comprises a metal oxide in a channel formation region.

* * * * *